(12) United States Patent
Wang et al.

(10) Patent No.: US 12,471,220 B2
(45) Date of Patent: Nov. 11, 2025

(54) DISPLAY MODULE AND METHOD FOR MANUFACTURING THE SAME, AND DISPLAY DEVICE

(71) Applicants: BOE MLED Technology Co., Ltd., Beijing (CN); BOE TECHNOLOGY GROUP CO., LTD., Beijing (CN)

(72) Inventors: Jing Wang, Beijing (CN); Mingming Jia, Beijing (CN); Lili Wang, Beijing (CN); Sha Feng, Beijing (CN); Chao Liu, Beijing (CN); Ming Zhai, Beijing (CN); Haiwei Sun, Beijing (CN); Lingyun Shi, Beijing (CN); Liqiang Wang, Beijing (CN); Jingjing Zhang, Beijing (CN)

(73) Assignees: BOE MLED TECHNOLOGY CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/915,707

(22) PCT Filed: Nov. 1, 2021

(86) PCT No.: PCT/CN2021/127977
§ 371 (c)(1),
(2) Date: Sep. 29, 2022

(87) PCT Pub. No.: WO2023/070673
PCT Pub. Date: May 4, 2023

(65) Prior Publication Data
US 2024/0164022 A1 May 16, 2024

(51) Int. Cl.
*H05K 1/18* (2006.01)
*H01L 23/00* (2006.01)
(Continued)

(52) U.S. Cl.
CPC ............. *H05K 1/189* (2013.01); *H01L 24/05* (2013.01); *H01L 24/06* (2013.01); *H01L 24/32* (2013.01);
(Continued)

(58) Field of Classification Search
CPC combination set(s) only.
See application file for complete search history.

(56) References Cited

U.S. PATENT DOCUMENTS

2014/0091704 A1* 4/2014 Furuie ................ H10K 59/8792
445/24
2016/0306450 A1* 10/2016 Chen ...................... G06F 3/0443
(Continued)

*Primary Examiner* — William B Partridge
*Assistant Examiner* — Felix B Andrews
(74) *Attorney, Agent, or Firm* — XSENSUS LLP

(57) ABSTRACT

A display module includes a display panel with a plurality of bonding electrodes arranged at intervals along a selected side edge of a non-display surface and divided into two bonding electrode groups, a first flexible circuit board and a second flexible circuit board. For the first flexible circuit board, each first conductive contact piece in a first wiring region is connected to a bonding electrode in a first bonding electrode group. For the second flexible circuit board, each second conductive contact piece in a second wiring region is connected to a bonding electrode in a second bonding electrode group. The first wiring region is closer to the selected side edge than the second wiring region in a first direction. The first fan-out region is spaced apart from the second wiring region in a second direction perpendicular to the first direction.

20 Claims, 27 Drawing Sheets

(51) Int. Cl.
*H05K 1/11* (2006.01)
*H01L 25/075* (2006.01)
(52) U.S. Cl.
CPC .............. *H01L 24/83* (2013.01); *H05K 1/118*
(2013.01); *H01L 25/0753* (2013.01); *H01L 2224/05573* (2013.01); *H01L 2224/06155* (2013.01); *H01L 2224/32225* (2013.01); *H01L 2224/8313* (2013.01); *H01L 2224/83201* (2013.01); *H05K 2201/056* (2013.01); *H05K 2201/10128* (2013.01)

(56) References Cited

U.S. PATENT DOCUMENTS

| | | | |
|---|---|---|---|
| 2017/0363919 A1* | 12/2017 | Li | G06F 3/044 |
| 2018/0061858 A1* | 3/2018 | Lee | G02F 1/136209 |
| 2019/0206784 A1* | 7/2019 | Oh | H10K 59/131 |
| 2020/0133438 A1* | 4/2020 | Kim | G06F 3/0448 |
| 2020/0348733 A1* | 11/2020 | Ju | G06F 1/1683 |

* cited by examiner

DISPLAY MODULE AND METHOD FOR MANUFACTURING THE SAME, AND DISPLAY DEVICE

CROSS-REFERENCE TO RELATED APPLICATION

This application is a national phase entry under 35 USC 371 of International Patent Application No. PCT/CN2021/127977 filed on Nov. 1, 2021, which is incorporated herein by reference in its entirety.

TECHNICAL FIELD

The present disclosure relates to the field of display technologies, and in particular, to a display module and a method for manufacturing the same, and a display device.

BACKGROUND

As display devices have higher and higher requirements for pixel density and resolution, light-emitting diode (LED) dies in the display device are getting smaller and smaller. The smaller the LED dies, the more significant the technical advantages. Thus, mini LEDs and micro LEDs came into being, which have wide application prospects. At present, a mini LED tiled display device/a micro LED tiled display device is formed by tiling display devices capable of displaying images independently, where seamless tiling display technology is a technical difficulty in tiling the display devices.

SUMMARY

In one aspect, a display module is provided. The display module includes: a display panel, a first flexible circuit board and a second flexible circuit board.

A non-display surface of the display panel includes a plurality of side edges, and the plurality of side edges include at least one selected side edge. The display panel includes a plurality of bonding electrodes disposed on the non-display surface, and the plurality of bonding electrodes are sequentially arranged at intervals along a selected side edge. The plurality of bonding electrodes are divided into a first bonding electrode group and a second bonding electrode group. The first bonding electrode group includes a portion of the plurality of bonding electrodes, and the second bonding electrode group includes another portion of the plurality of bonding electrodes.

The first flexible circuit board has a first wiring region and a first fan-out region that are connected to each other. The first wiring region is closer to the selected side edge than the first fan-out region. The first flexible circuit board includes a plurality of first conductive contact pieces that are arranged at intervals in the first wiring region. Each first conductive contact piece is electrically connected to a bonding electrode in the first bonding electrode group.

The second flexible circuit board has a second wiring region and a second fan-out region that are connected to each other. The second wiring region is closer to the selected side edge than the second fan-out region. The second flexible circuit board includes a plurality of second conductive contact pieces that are arranged at intervals in the second wiring region. Each second conductive contact piece is electrically connected to a bonding electrode in the second bonding electrode group.

The first wiring region is closer to the selected side edge than the second wiring region in a first direction. The first fan-out region and the second wiring region have a distance therebetween in a second direction. The first direction is perpendicular to the second direction. The second direction is an extension direction of the selected side edge.

In some embodiments, in the first direction, an edge of the first wiring region away from the selected side edge is closer to the selected side edge than an edge of the second wiring region proximate to the selected side edge.

In some embodiments, in the first direction, a distance between the second wiring region and the first wiring region is greater than 1 mm.

In some embodiments, in the second direction, a minimum distance between the first fan-out region and the second wiring region is greater than 1 mm.

In some embodiments, the display panel further includes: a display surface, a plurality of side surfaces connecting the display surface to the non-display surface and a plurality of side lines arranged at intervals on a side surface in the plurality of side surfaces proximate to the selected side edge. An end of each side line extends to the display surface, and another end of the side line extends to the non-display surface. The another end of the side line extending to the non-display surface serves as one of the plurality of the bonding electrodes.

In some embodiments, the plurality of bonding electrodes each extend in the first direction, and a minimum of lengths of bonding electrodes in the first bonding electrode group in an extension direction thereof is less than a minimum of lengths of bonding electrodes in the second bonding electrode group in an extension direction thereof.

In some embodiments, the plurality of first conductive contact pieces are in one-to-one correspondence with a plurality of bonding electrodes in the first bonding electrode group. The plurality of second conductive contact pieces are in one-to-one correspondence with a plurality of bonding electrodes in the second bonding electrode group. The display module further includes a first adhesive film and a second first adhesive film. The first adhesive film is located between the plurality of first conductive contact pieces and the first bonding electrode group, and the first adhesive film is in direct contact with the plurality of first conductive contact pieces and the first bonding electrode group. The second adhesive film is located between the plurality of second conductive contact pieces and the second bonding electrode group, and the second adhesive film is in direct contact with the plurality of second conductive contact pieces and the second bonding electrode group. The first adhesive film and the second adhesive film each extend in the second direction. The first adhesive film is closer to the selected side edge than the second adhesive film.

In some embodiments, the display panel further includes at least one alignment mark disposed on the non-display surface. The at least one alignment mark is used for an alignment between the plurality of the first conductive contact pieces and bonding electrodes in the first bonding electrode group and an alignment between the plurality of second conductive contact pieces and bonding electrodes in the second bonding electrode group during connection.

In some embodiments, the alignment mark includes a mark pattern and a clearance region disposed around the mark pattern, and the clearance region is insulated from a region around the clearance region.

In some embodiments, the at least one alignment mark includes a plurality of alignment marks. The plurality of alignment marks includes a first alignment mark group, a second alignment mark group and a third alignment mark group that are arranged at intervals in the first direction.

The first wiring region of the first flexible circuit board includes a first bonding region and a first alignment mark region that are arranged in the first direction. The first alignment mark region is connected to the first fan-out region. The plurality of first conductive contact pieces are disposed in the first bonding region. The second wiring region of the second flexible circuit board includes a second bonding region and a second alignment mark region that are arranged in the first direction. The second alignment mark region is connected to the second fan-out region. The plurality of second conductive contact pieces are disposed in the second bonding region.

The first alignment mark group includes a first alignment sub-mark and a second alignment sub-mark. A mark pattern of the first alignment sub-mark and a mark pattern of the second alignment sub-mark are located within an orthographic projection of the first alignment mark region on the non-display surface, and the mark pattern of the first alignment sub-mark is symmetrical with the mark pattern of the second alignment sub-mark with respective to an center line, in the first direction, of the orthographic projection of the first alignment mark region on the non-display surface. The first alignment sub-mark is closer to a side edge, which is connected to the selected side edge and proximate to the first alignment mark group, of the non-display surface than the second alignment sub-mark.

The second alignment mark group includes a third alignment sub-mark, a fourth alignment sub-mark and a fifth alignment sub-mark. A mark pattern of the third alignment sub-mark and a mark pattern of the fourth alignment sub-mark are located within an orthographic projection of the second alignment mark region on the non-display surface. The mark pattern of the third alignment sub-mark is symmetrical with the mark pattern of the fourth alignment sub-mark with respective to a center line, in the first direction, of the orthographic projection of the second alignment mark region on the non-display surface. The fourth alignment sub-mark is closer to a side edge of the non-display surface than the third alignment sub-mark. A center of the five alignment sub-marks, a center of the third alignment sub-mark and a center of the fourth alignment sub-mark are located on a same line in the second direction. A mark pattern of the fifth alignment sub-mark is located on another side, which is connected to the selected side edge, of an orthographic projection of the first fan-out region on the non-display surface in the second direction.

The third alignment mark group includes a sixth alignment sub-mark and a seventh alignment sub-mark; a mark pattern of the sixth alignment sub-mark is symmetrical with a mark pattern of the seventh alignment sub-mark with respective to a center line of the non-display surface in the first direction; the mark pattern of the seventh alignment sub-mark is located on a side of an orthographic projection of the second fan-out region on the non-display surface in the second direction.

In some embodiments, the at least one selected side edge includes two selected side edges disposed opposite to each other. The selected side edge corresponding to the plurality of bonding electrodes, the first flexible circuit board and the second flexible circuit board is a selected side edge of the two selected side edges. The display panel further includes another plurality of bonding electrodes disposed on the non-display surface. The display module further includes another first flexible circuit board and another second flexible circuit board. The another first flexible circuit board are bonded to a first bonding electrode group included in the another plurality of bonding electrodes at another selected side edge of the two selected side edges. The another second flexible circuit board are bonded to a second bonding electrode group included in the another plurality of bonding electrodes at the another selected side edge of the two selected side edges. The first flexible circuit board corresponding to the selected side edge is disposed opposite to the another second flexible circuit board corresponding to the another selected side edge. The second flexible circuit board corresponding to the selected side edge is disposed opposite to the another first flexible circuit board corresponding to the another selected side edge.

In some embodiments, the at least one selected side includes two selected side edges disposed opposite to each other. The selected side edge corresponding to the plurality of bonding electrodes, the first flexible circuit board and the second flexible circuit board is a selected side edge of the two selected side edges. The display panel further includes another plurality of bonding electrodes disposed on the non-display surface. The display module further includes a third flexible circuit board. The third flexible circuit board are bonded to the another plurality of bonding electrodes at another selected side edge of the two selected side edges. In the second direction, a maximum dimension of the third flexible circuit board is greater than a maximum dimension of each of the first flexible circuit board and the second flexible circuit board.

In another aspect, a display device is provided. The display device includes the display module according to any one of the above embodiments.

In yet another aspect, a method for manufacturing a display module is provided. The method includes the following steps:

forming an initial display panel, wherein a non-display surface of the initial display panel includes a plurality of side edges, and the plurality of side edges include at least one selected side edge;

forming a plurality of bonding electrodes on the non-display surface to provide a display panel including the initial display panel and the plurality of bonding electrodes, wherein the plurality of bonding electrodes are sequentially arranged at intervals along a selected side edge; the plurality of bonding electrodes are divided into a first bonding electrode group and a second bonding electrode group; and the first bonding electrode group includes a portion of the plurality of bonding electrodes, and the second bonding electrode group includes another portion of the plurality of bonding electrodes; and electrically connecting a first flexible circuit board and a second flexible circuit board to the plurality of bonding electrodes, wherein the first flexible circuit board has a first wiring region and a first fan-out region that are connected to each other; the first wiring region is closer to the selected side edge than the first fan-out region; the first flexible circuit board includes a plurality of first conductive contact pieces that are arranged at intervals in the first wiring region; each first conductive contact piece is electrically connected to a bonding electrode in the first bonding electrode group; the second flexible circuit board has a second wiring region and a second fan-out region that are connected to each other; the second wiring region is closer to the selected side edge than the second fan-out region; the second flexible circuit board includes a plurality of second conductive contact pieces that are arranged at intervals in the second wiring region; and each second conductive contact piece is electrically connected to a bonding electrode in the second bonding electrode group.

The first wiring region is closer to the selected side edge than the second wiring region in a first direction. The first fan-out region and the second wiring region have a distance therebetween in a second direction. The first direction is perpendicular to the second direction; and the second direction is an extension direction of the selected side edge.

In some embodiments, before forming the plurality of bonding electrodes on the non-display surface, the method further includes:

forming a protective film having a target shape, wherein the protective film includes a first portion and a second portion that are arranged in a third direction; a dimension of the first portion in a fourth direction is greater than a dimension of the second portion in the fourth direction; in the fourth direction, an end of the first portion and an end of the second portion that are located on a same side are flush with each other, and a maximum dimension of the protective film in the third direction is greater than or equal to a dimension of the non-display surface in the second direction, wherein the third direction is parallel to the second direction, and the fourth direction is parallel to the first direction;

attaching the protective film to a target position of the non-display surface of the initial display panel, wherein a direction in which the first portion and the second portion are arranged is parallel to the second direction; the end of the first portion and the end of the second portion flush with each other are away from the selected side edge; and each of the first portion and the second portion is at a designated distance from the selected side edge; and forming a metal layer at least on the non-display panel based on the protective film.

Forming the plurality of bonding electrodes on the non-display surface, includes: etching the metal layer to form the plurality of bonding electrodes on the non-display surface, wherein the plurality of bonding electrodes are divided into the first bonding electrode group and the second bonding electrode group with a boundary between the first portion and the second portion of the protective film as a dividing line.

In some embodiments, the method further comprising: forming at least one alignment mark on the non-display surface. The at least one alignment mark includes a first alignment mark group, a second alignment mark group and a third alignment mark group that are arranged at internals in the first direction. The first alignment mark group includes a first alignment sub-mark and a second alignment sub-mark. The second alignment mark group includes a third alignment sub-mark, a fourth alignment sub-mark and a fifth alignment sub-mark; and the third alignment mark group includes a sixth alignment sub-mark and a seventh alignment sub-mark.

Forming the protective film having the target shape, includes: forming the protective film including a first hollowed-out region, a second hollowed-out region and a third hollowed-out region. The first hollowed-out region, the second hollowed-out region and the third hollowed-out region respectively correspond to a position of the fifth alignment sub-mark, a position of the sixth alignment sub-mark and a position of the seventh alignment sub-mark.

Attaching the protective film to the target position of the non-display surface of the initial display panel, includes: causing portions of the non-display surface corresponding to the first hollowed-out region, the second hollowed-out region and the third hollowed-out region of the protective film to be exposed.

Forming the metal layer at least on the non-display panel based on the protective film, includes: causing the metal layer to further cover the portions, respectively exposing the first hollowed-out region, the second hollowed-out region and the third hollowed-out region of the protective film, of the non-display surface.

Etching the metal layer to form the plurality of bonding electrodes on the non-display surface, including: forming the first alignment sub-mark, the second alignment sub-mark, the third alignment sub-mark, the fourth alignment sub-mark, the fifth alignment sub-mark, the sixth alignment sub-mark and the seventh alignment sub-mark simultaneously.

In some embodiments, electrically connecting the first flexible circuit board and the second flexible circuit board to the plurality of bonding electrodes, includes: aligning the first flexible circuit board and the second flexible circuit board with the plurality of bonding electrodes according to the first alignment mark group, the second alignment mark group and the third alignment mark group; and electrically connecting the first flexible circuit board and the second flexible circuit board are to the plurality of bonding electrodes.

In some embodiments, the method further includes: according to the fourth alignment sub-mark and the fifth alignment sub-mark, coating a target position of the first bonding electrode group with a first adhesive film, and coating a target position of the second bonding electrode group with a second adhesive film; connecting the first flexible circuit board to the first bonding electrode group through the first adhesive film; and connecting the second flexible circuit board to the second bonding electrode group through the second adhesive film. The first adhesive film and the second adhesive film each extend in the second direction. The first adhesive film is closer to the selected side edge than the second adhesive film.

In some embodiments, the initial display panel further includes a display surface and a plurality of side surfaces connecting the display surface to the non-display surface. Forming the plurality of bonding electrodes on the non-display surface, includes: forming a plurality of side lines simultaneously on a side surface proximate to the selected side edge. The plurality of side lines are arranged at intervals. An end of each side line extends to the display surface, and another end of the side line extends to the non-display surface. The another end of the side line extends to the non-display surface serves as one of the plurality of bonding electrodes.

In some embodiments, the method further includes: after etching the metal layer and before a step of electrically connecting the first flexible circuit board and the second flexible circuit board to the plurality of bonding electrodes, peeling off the protective film is from the non-display surface.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person having ordinary skill in the art can obtain other drawings according to these accompanying drawings. In addition, the accompanying drawings in the following description may be regarded as schematic diagrams, but are not limitations on an actual size of a product, an actual process of a method and an actual timing of a signal involved in the embodiments of the present disclosure.

DETAILED DESCRIPTION

Figure 1:
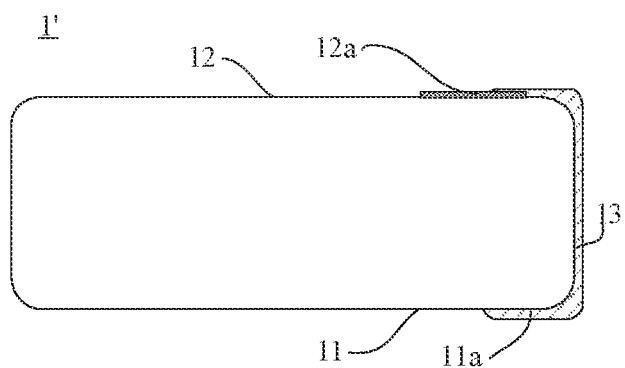
FIG. 1 is a structural diagram of a display panel.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms does not necessarily refer to the same embodiment(s) or examples(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, the features defined with "first" and "second" may explicitly or implicitly include one or more of the features. In the description of the embodiments of the present disclosure, the term "a plurality of/the plurality of" means two or more unless otherwise specified.

Some embodiments may be described using the terms "coupled" and "connected" and their derivatives. For example, the term "connected" may be used in the description of some embodiments to indicate that two or more components are in direct physical or electrical contact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting" depending on the context. Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phrase "applicable to" or "configured to" as used herein indicates an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Terms such as "about", "substantially" or "approximately" as used herein include a stated value and an average value within an acceptable range of deviation of a particular value. The acceptable range of deviation is determined by a person of ordinary skill in the art in view of the measurement in question and the error associated with the measurement of a particular quantity (i.e., limitations of a measurement system).

As used herein, the terms such as "parallel", "perpendicular" or "equal" include a stated case and a case similar to the stated case. The similar case is within an acceptable range of deviation, and the acceptable range of deviation is determined by a person of ordinary skill in the art in view of measurement in question and errors associated with measurement of a particular quantity (i.e., limitations of a measurement system). For example, the term "parallel" includes absolute parallelism and approximate parallelism, and an acceptable range of deviation of the approximate parallelism may be a deviation within 5°. For example, the term "perpendicular" includes absolute perpendicularity and approximate perpendicularity, and an acceptable range of deviation of the approximate perpendicularity may be a deviation within 5°. For example, the term "equal" includes absolute equality and approximate equality, and an acceptable range of deviation of the approximate equality may refer to that, a difference between two equals is less than or equal to 5% of either of the two equals.

It will be understood that, in a case where a layer or an element is described as being on another layer or a substrate, the layer or the element may be directly on the another layer or the substrate, or there may be intermediate layer(s) between the layer or the element and the another layer or the substrate.

Exemplary embodiments are described herein with reference to sectional views and/or plan views as idealized exemplary drawings. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing.

Therefore, the regions shown in the accompanying drawings are schematic in nature, and their shapes are not intended to show actual shapes of the region in a device, and are not intended to limit the scope of the exemplary embodiments.

Figure 2:
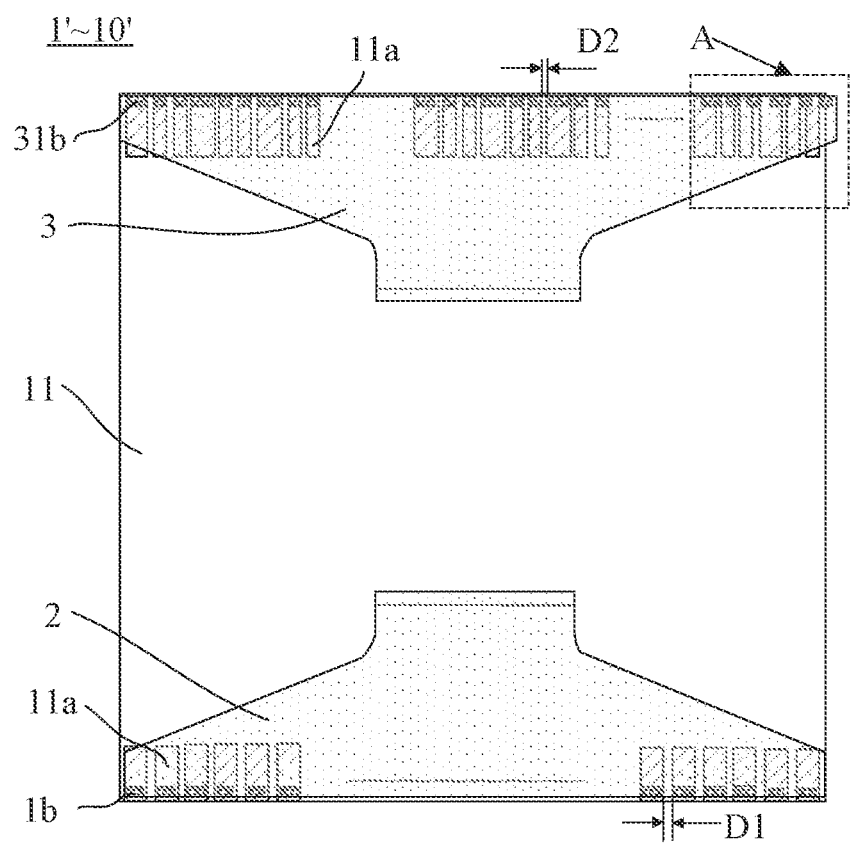
FIG. 2 is a structural diagram of a display module.

In related art, for a single display panel, lines on a display surface of the display panel may be connected to a driver disposed on a non-display surface of the display panel by using lines disposed on a side surface of the display panel, so that a distance between adjacent display panels may be shortened in a case where a plurality of display panels are tiled to form a large-sized display device. A structure of a display panel 1' is as shown in FIG. 1. A film layer on a side surface of the display panel 1' is formed into side lines 13. An end of the side line 13 extending to the display surface 12 is connected to a film layer 12a on a display surface 12. The film layer 12a on the display surface 12 includes all of signal lines, power supply lines, control lines, etc. An end of the side line 13 located on a non-display surface 11 serves as a bonding electrode 11a for being connected with a flexible circuit board. As shown in FIG. 2, conductive contact pieces 1b on a side of a flexible circuit board 2 are connected to corresponding bonding electrodes 11a, and the other side of the flexible circuit board 2 is connected with a driver (e.g., a printed circuit board (PCB) or a system circuit board, which is not shown in the figure), so that a display module 10' is formed. The display module 10' is connected to the driver on the non-display surface 11' of the display panel 1' to realize connection of circuits in a product.

Figure 3:
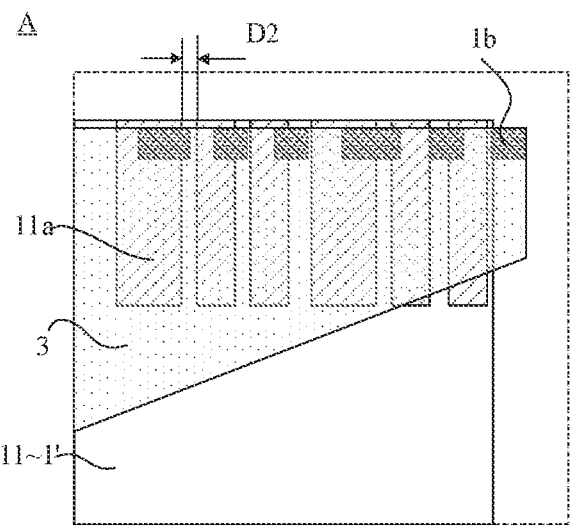
FIG. 3 is an enlarged view of the region A of the display module shown in FIG. 2.

It is found by the inventors that, with continued reference to FIG. 2, considering a lower side edge in the figure as an example, in a case where an arrangement density of bonding electrodes 11a that are disposed along this side edge of the non-display surface 11 of the display panel 1' is small, a distance D1 between two adjacent bonding electrodes 11a is large. The distance D1 here may be understood as an average of distances between adjacent bonding electrodes 11a. The conductive contact pieces 1b in the flexible circuit board 2 with a large length may be bonded to corresponding bonding electrodes 11a to realize the connection of the circuits. That is, a production tolerance of the flexible circuit board 2 meets bonding requirements. A flexible circuit board includes a board body and a plurality of conductive contact pieces disposed on the board body. The plurality of conductive contact pieces are sequentially arranged at intervals in a same direction. A tolerance of the flexible circuit board is related to a length of the flexible circuit board and a number of the conductive contact pieces 1b thereon. The length of the flexible circuit board is a dimension of the board body in a direction in which the plurality of conductive contact pieces thereon are arranged. The greater the length of the flexible circuit board, the greater the tolerance of the flexible circuit board. In addition, the more the conductive contact pieces 1b disposed in the flexible circuit board in a length direction thereof, i.e., the greater the density of the conductive contact pieces 1b, the greater the tolerance of the flexible circuit board. For example, for a flexible circuit board with a large length, such as a length of 150 mm, a value of the tolerance is about ±100 μm at present. However, for some display panels with a high pixel density, a number of signal lines is correspondingly large. Since the number of the conductive contact pieces is substantially positively correlated with the number of the signal lines, the number of conductive contact pieces per unit area increases, and the value of the tolerance of the circuit board needs to be ±50 μm at the maximum to meet the requirements. Consequently, there is a problem that a tolerance limit of existing flexible circuit boards cannot meet bonding requirements of a specific display panel. With continued reference to FIG. 2, considering an upper side edge of the display panel in the figure as an example, an arrangement density of bonding electrodes 11a disposed along this side edge is high. That is, in order to satisfying connection requirements of the film layer 12a on the display surface 12 of the display panel 1', a large number of bonding electrodes 11a are formed along the side edge of the non-display surface 11 of the display panel 1'. This causes that a distance D2 between adjacent bonding electrodes 11a is small. Thus, corresponding conductive contact pieces 1b in a required flexible circuit board 3 needs to be densely arranged accordingly. However, in a case where a length of the flexible circuit board 3 is large, a present process limit of flexible circuit boards cannot meet requirements. The distance D2 here may be understood as an average of distances between bonding electrodes 11a. As shown in FIGS. 2 and 3, when the flexible circuit board 3 is bonded to the bonding electrodes 11a on the non-display surface 11 of the display panel 1', misalignments between the bonding electrodes 11a and the conductive contact pieces 1b of the flexible circuit board 3 will happen during bonding. Thus, there is a problem that the conductive contact pieces 1b of the flexible circuit board 3 cannot be connected to corresponding bonding electrodes 11a, and the flexible circuit board 3 is dislocated relative to the display panel 1', which decreases a product yield.

Figure 4:
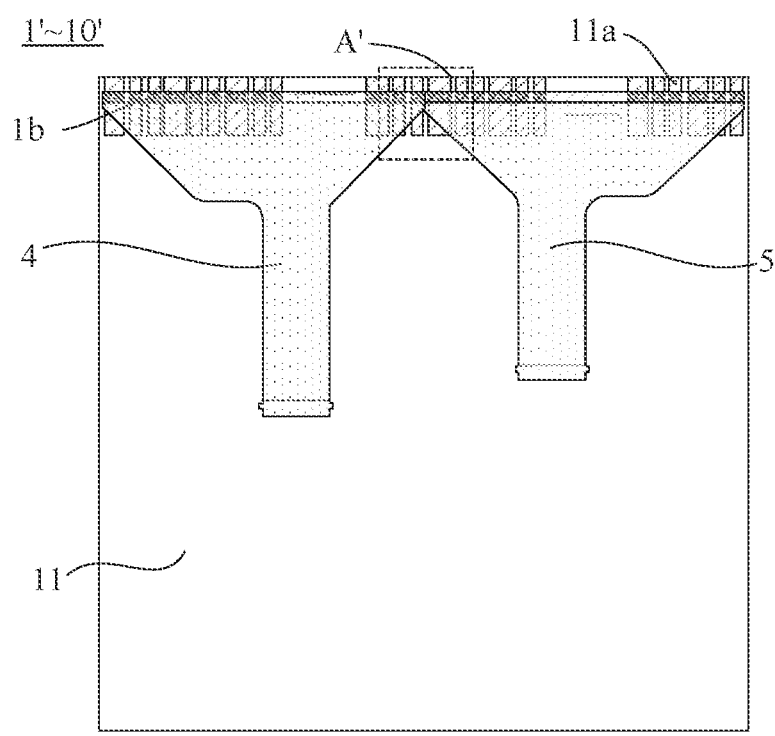
FIG. 4 is a structural diagram of another display module.

In order to solve the problem that the flexible circuit board with the large length and high density of conductive contact pieces 1b cannot meet the bonding requirements, as shown in FIG. 4, the inventors use two flexible circuit boards with a small length to replace the flexible circuit with the large length to be bonded to the bonding electrodes 11a on the non-display surface 11 of the display panel 1'. A tolerance of the flexible circuit board with the small length is small, and a dimensional tolerance of an existing flexible circuit board with mass production level may meet the bonding requirements. For example, the tolerance of a flexible circuit board with a length of 60 mm is ±30 μm, which is less than ±50 μm and may meet the requirements.

Figure 5:
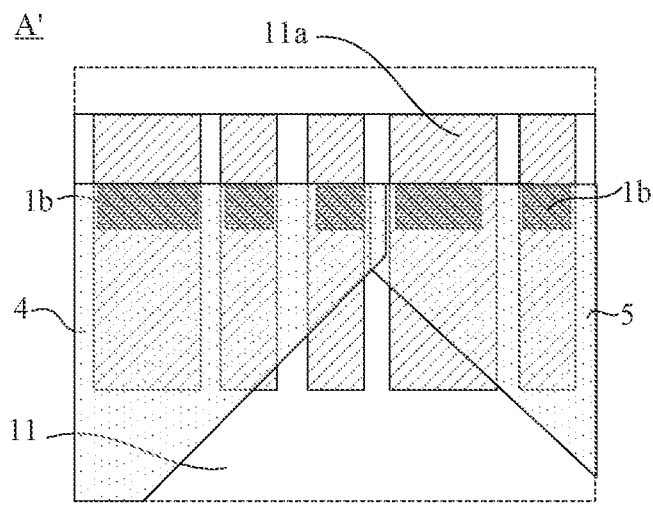
FIG. 5 is an enlarged view of the region A' of the display module shown in FIG. 4.

However, it is found by the inventors that, if the two flexible circuit boards with a small length, such as a flexible circuit board 4 and a flexible circuit board 5, are bonded with the bonding electrodes 11a on the non-display surface 11 of the display panel 1' along a same horizontal line, as shown in FIGS. 4 and 5, the flexible circuit board 4 will overlap with the flexible circuit board 5. That is, a flexible circuit board bonded later will inevitably press a flexible circuit board bonded first, and there is a problem of mutual interference between the two flexible circuit boards. For example, after conductive contact pieces 1b of the flexible circuit board 5 are connected to corresponding bonding electrodes 11a, the flexible circuit board 4 will cover an edge region of the flexible circuit board 5 when conductive contact pieces 1b of the flexible circuit board 4 are connected to corresponding bonding electrodes 11a, which results in the mutual interference between the flexible circuit board 4 and the flexible circuit board 5.

Figure 6:
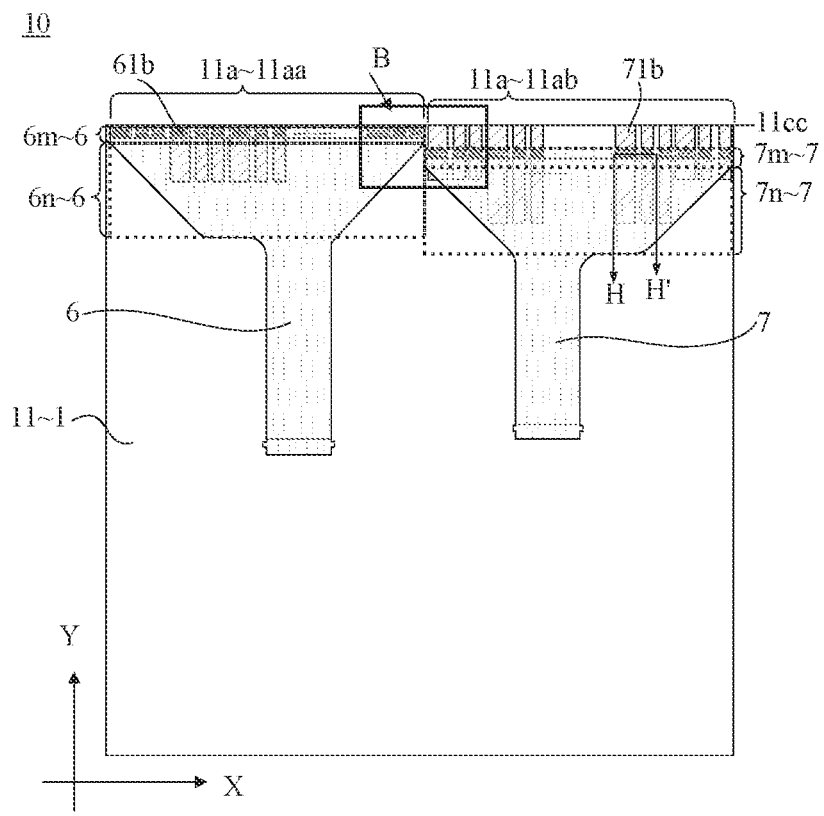
FIG. 6 is a structural diagram of a display module, in accordance with some embodiments of the present disclosure.

In light of this, some embodiments of the present disclosure provide a display module 10. As shown in FIG. 6, the display module 10 includes a display panel 1, a first flexible circuit board 6 and a second flexible circuit board 7.

Figure 7:
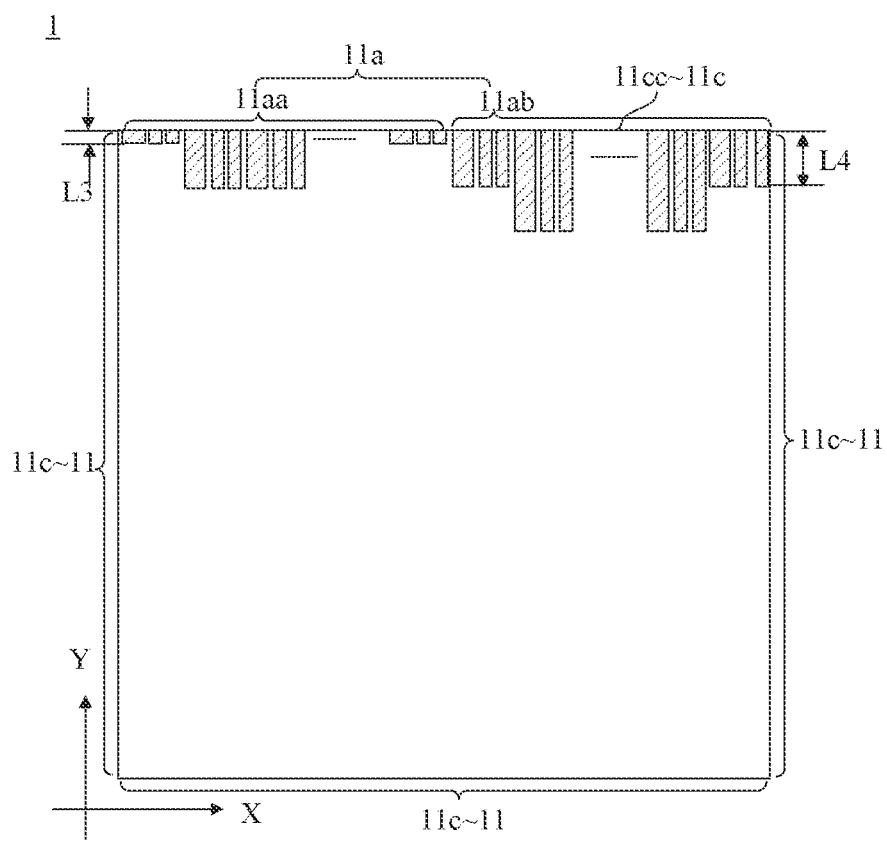
FIG. 7 is a structural diagram of a display panel, in accordance with some embodiments of the present disclosure.

As shown in FIG. 7, a non-display surface 11 of the display panel 1 includes a plurality of side edges 11c, and at least one side edge 11c is a selected side edge 11cc. The display panel 1 includes a plurality of bonding electrodes 11a disposed on the non-display surface 11. The plurality of bonding electrodes 11a are sequentially arranged at intervals along the selected side edge 11cc. The plurality of bonding electrodes 11a are divided into a first bonding electrode group 11aa and a second bonding electrode group 11ab. The first bonding electrode group 11aa includes a portion of the plurality of bonding electrodes 11a, and the second bonding electrode group 11ab includes the other portion of the plurality of bonding electrodes 11a.

In some embodiments, with continued reference to FIG. 7, one side edge 11c of the non-display surface 11 is the selected side edge 11cc.

It will be noted that, as shown in FIG. 7, extension lengths of the plurality of bonding electrodes 11a in the display panel 1 may be different, which may be caused by a method for manufacturing the display module 10. A specific formation process will be described in detail in the method for manufacturing the display module 10 below. Of course, the plurality of bonding electrodes 11a may have specially designed pattern, which is not limited here. Lengths of a plurality of bonding electrodes 11a in the first bonding electrode group 11aa are not necessarily different, but may be same. Similarly, lengths of a plurality of bonding electrodes 11a in the second bonding electrode group 11ab are not necessarily different, but may be same.

Figure 8:
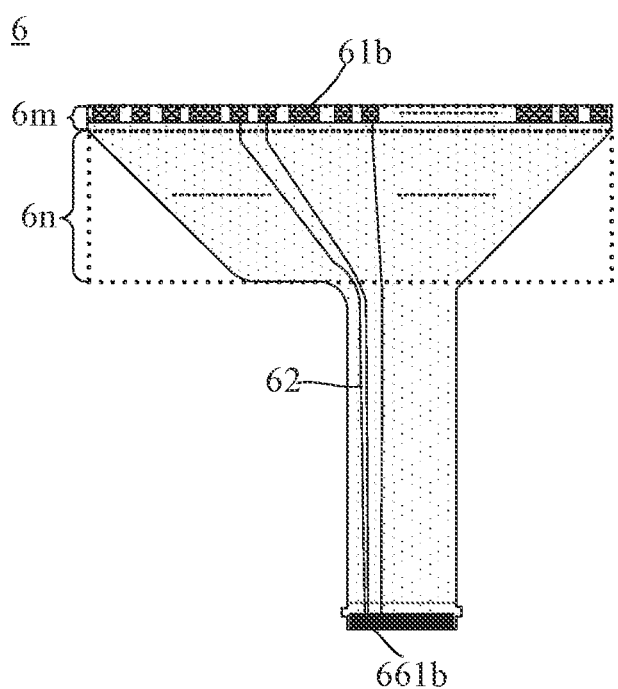
FIG. 8 is a structural diagram of a first flexible circuit board, in accordance with some embodiments of the present disclosure.

As shown in FIGS. 8 and 6, the first flexible circuit board 6 includes a first wiring region 6m and a first fan-out region 6n that are connected to each other, and the first wiring region 6m is closer to the selected side edge 11cc than the first fan-out region 6n. The first wiring region 6m is provided therein with a plurality of first conductive contact pieces 61b that are arranged at intervals. Each first conductive contact piece 61b is electrically connected to a bonding electrode 11a in the first bonding electrode group 11aa.

In some embodiments, with continued reference to FIG. 8, the other end of the first flexible circuit board 6 opposite to the first wiring region 6m is provided with a plurality of third conductive contact pieces 661b that are arranged at intervals. A plurality of first connection lines 62 that are arranged at intervals are disposed on the first flexible circuit board 6. Each first connection line 62 extends in the first wiring area 6m and the first fan-out region 6n. An end of each first connection line 62 is electrically connected to a first conductive contact piece 61b, and the other end of each first connection line 62 is connected to a third conductive contact piece 661b. The plurality of third conductive contact pieces 661b are further connected to a driver on the non-display surface 11.

Figure 9:
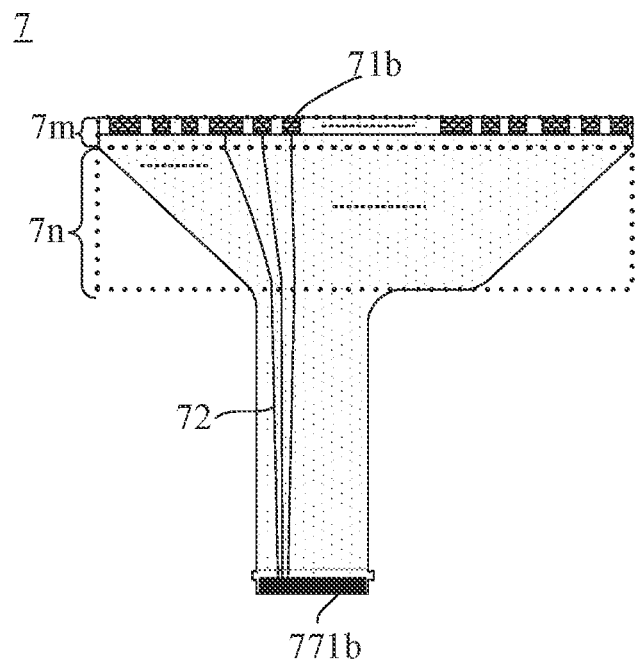
FIG. 9 is a structural diagram of a second flexible circuit board, in accordance with some embodiments of the present disclosure.

As shown in FIGS. 9 and 6, the second flexible circuit board 7 includes a second wiring region 7m and a second fan-out region 7n that are connected to each other, and the second wiring region 7m is closer to the selected side edge 11cc than the second fan-out region 7n. The second wiring region 7m is provided therein with a plurality of second conductive contact pieces 71b that are arranged at intervals. Each second conductive contact piece 71b is electrically connected to a bonding electrode 11a in the second bonding electrode group 11ab.

In some embodiments, with continued reference to FIG. 9, the other end of the second flexible circuit board 7 opposite to the second wiring region 7m is provided with a plurality of fourth conductive contact pieces 771b that are arranged at intervals. A plurality of second lines 63 are disposed on the second flexible circuit board 7. Each second line 63 extends in the second wiring region 7m and the second fan-out region 7n. An end of each second line 63 is electrically connected to a second conductive contact piece 71b, and the other end of the second line 63 is electrically connected to a fourth conductive contact piece 771b. The plurality of fourth conductive contact pieces 771b are further connected to the driver on the non-display surface 11.

Figure 10:
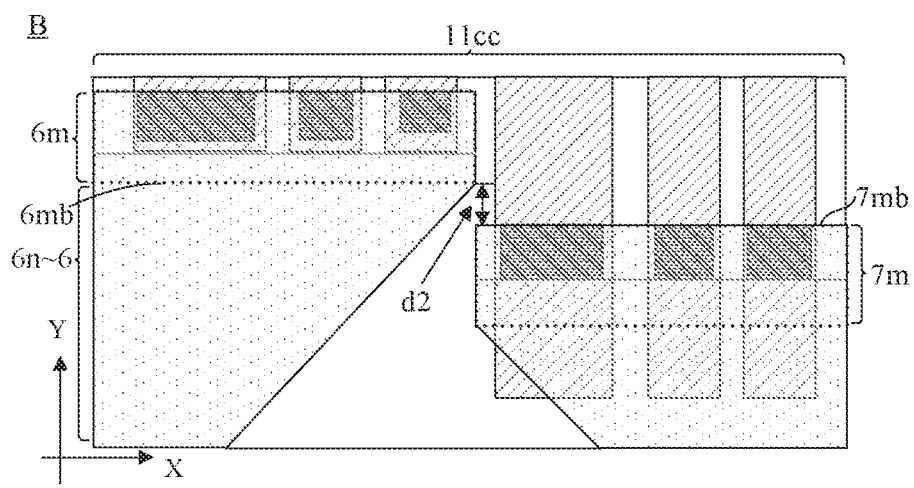
FIG. 10 is an enlarged view of the region B of the display module shown in FIG. 6, in accordance with some embodiments of the present disclosure.
Figure 11:
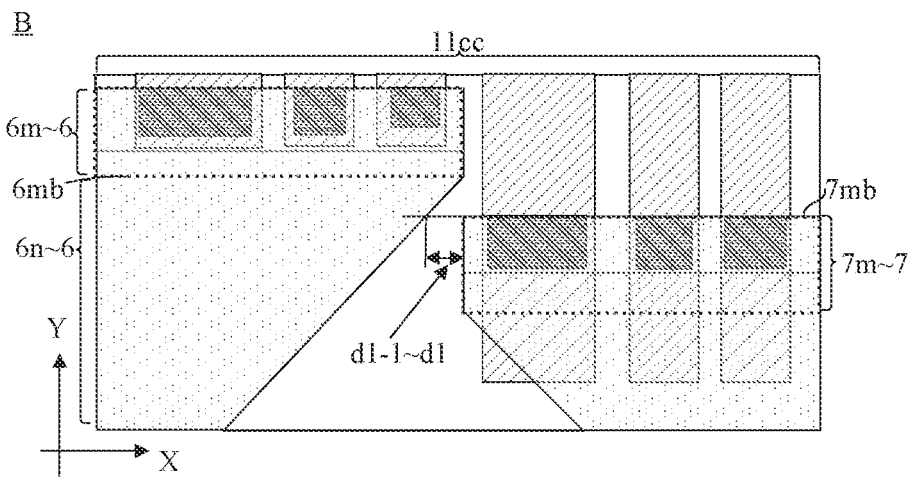
FIG. 11 is an enlarged view of the region B of the display module shown in FIG. 6, in accordance with some embodiments of the present disclosure.

In some embodiments, as shown in FIGS. 6 and 10, in a first direction Y, the first wiring region 6m is closer to the selected side edge 11cc than the second wiring region 7m. With continued reference to FIG. 10, an entire of the first wiring region 6m is closer to the selected side edge 11cc than an entire of the second wiring region 7m. That is to say, the first wiring region 6m of the first flexible circuit board 6 and the second wiring region 7m of the second flexible circuit board 7 are not on a same horizontal line, and a region of the first flexible circuit board 6 for bonding to the first bonding electrode group and a region of the second flexible circuit board 7 for bonding to the first bonding electrode group are misaligned with each other. In addition, as shown in FIGS. 6 and 11, in a second direction X, the first fan-out region 6n and the second wiring region 7m have a distance d1 therebetween. The first direction Y is perpendicular to the second direction X, and the second direction X is an extension direction of the selected side edge 11cc. In this way, an orthographic projection of the first flexible circuit board 6 on the display panel 1 does not overlap with an orthographic projection of the second flexible circuit board 7 on the display panel 1.

The plurality of bonding electrodes 11a of the non-display surface 11 of the display panel 1 along the selected side edge 11cc are divided into the first bonding electrode group 11aa and the second bonding electrode group 11ab, and the flexible circuit board 6 and the second flexible circuit board 7 that both have a small length are electrically connected to the plurality of bonding electrodes 11a. For example, the first conductive contact pieces 61b of the first flexible circuit board 6 are electrically connected to the bonding electrodes 11a in the first bonding electrode group 11aa, and the second conductive contact pieces 71b of the second flexible circuit board 7 are electrically connected to the bonding electrodes 11a in the second bonding electrode group 11ab. The entire of the first wiring region 6m is closer to the selected side edge 11cc than the entire of the second wiring region 7m in the first direction Y, and the first fan-out region 6n and the second wiring region 7m have the distance d1 therebetween in the second direction X. In this way, the first flexible circuit board 6 and the second flexible circuit board 7 are bonded on the non-display surface 11 of the display panel 1 in a one-up-one-down dislocation manner. By such a design, the orthographic projection of the first flexible circuit board 6 on the display panel 1 does not overlap with the orthographic projection of the second flexible circuit board 7 on the display panel 1, which avoids the interference between the first flexible circuit board 6 and the second flexible circuit board 7; and moreover, the first flexible circuit board 6 and the second flexible circuit board 7 that have the small lengths meet bonding tolerance requirements of single-sided process, which facilitates a mass production of flexible circuit boards.

It will be noted that, the "one-up-one-down" in the description "the first flexible circuit board 6 and the second flexible circuit board 7 are bonded on the non-display surface 11 of the display panel 1 in a one-up-one-down dislocation manner" means that, a position relatively proximate to the selected side edge 11cc in the first direction Y represents "up", and a position relatively away from the selected side edge 11cc in the first direction Y represents "down".

In some embodiments, with reference to FIG. 10 again, for each flexible circuit board, a dimension of a fan-out region in the second direction is less than a dimension of a wiring region in the second direction; and further, a width of the fan-out region in the second direction X gradually decreases in the first direction Y gradually away from the selected side edge 11cc. Therefore, in order to realize that the two flexible circuits do not overlap with each other, it first needs to ensure that wiring regions of the two flexible circuits do not overlap with each other in appearance. In some examples, an edge 6mb of the first wiring region 6m away from of the selected side edge 11cc is closer to the selected side edge 11cc than an edge 7mb of the second wiring region 7m proximate to the selected side edge 11cc. For example, in the first direction Y, a distance d2 between the second wiring region 7m and the first wiring region 6m is greater than 1 mm. That is, in the first direction Y, the edge 6mb of the first wiring region 6m away from the selected side edge 11cc and the edge 7mb of the second wiring region 7m proximate to the selected side edge 11cc have a distance therebetween, and the distance is greater than 1 mm. For example, in the first direction Y, the distance d2 between the second wiring region 7m and the first wiring region 6m is 1.2 mm; alternatively, in the first direction Y, the distance d2 between the second wiring region 7m and the first wiring region 6m is 1.5 mm.

By setting the distance d2 between the second wiring region 7m and the first wiring region 6m in the first direction Y to be greater than 1 mm, it may be possible to bond each of the first flexible circuit board 6 and the second flexible circuit without interference, and prevent the first flexible circuit board 6 from overlapping with the second flexible circuit board 7 in the first direction Y, which achieves a purpose of no interference between the first flexible circuit board 6 and the second flexible circuit board 7.

In some embodiments, with reference to FIG. 11 again, in the second direction X, a minimum distance d1-1 between the first fan-out region 6n and the second wiring region 7m is greater than 1 mm. For example, the first fan-out region 6n may be in a shape of a trapezoid, the second wiring region 7m may be in a shape of a square, and a distance between the square second wiring region 7m and a hypotenuse of the trapezoidal first fan-out region 6n in the second direction is not constant, and there is a minimum distance d1-1. In the second direction X, the minimum distance d1-1 between the first fan-out region 6n and the second wiring region 7m is a minimum distance between an edge of the second wiring region 7m and an edge of the first fan-out region 6n that are adjacent to each other in the second direction X. The minimum distance d1-1 is greater than 1 mm. For example, in the second direction X, the minimum distance d1-1 between the first fan-out region 6n and the second wiring region 7m is 1.1 mm; alternatively, in the second direction X, the minimum distance d1-1 between the first fan-out region 6n and the second wiring region 7m is 1.35 mm.

By setting the minimum distance d1-1 between the first fan-out region 6n and the second wiring region 7m in the second direction X to be greater than 1 mm, it may be possible to bond each of the first flexible circuit board 6 and the second flexible circuit without interference and prevent the first flexible circuit board 6 from overlapping with the second flexible circuit board 7 in the second direction X, which achieves the purpose of no interference between the first flexible circuit board 6 and the second flexible circuit board 7.

Figure 12:
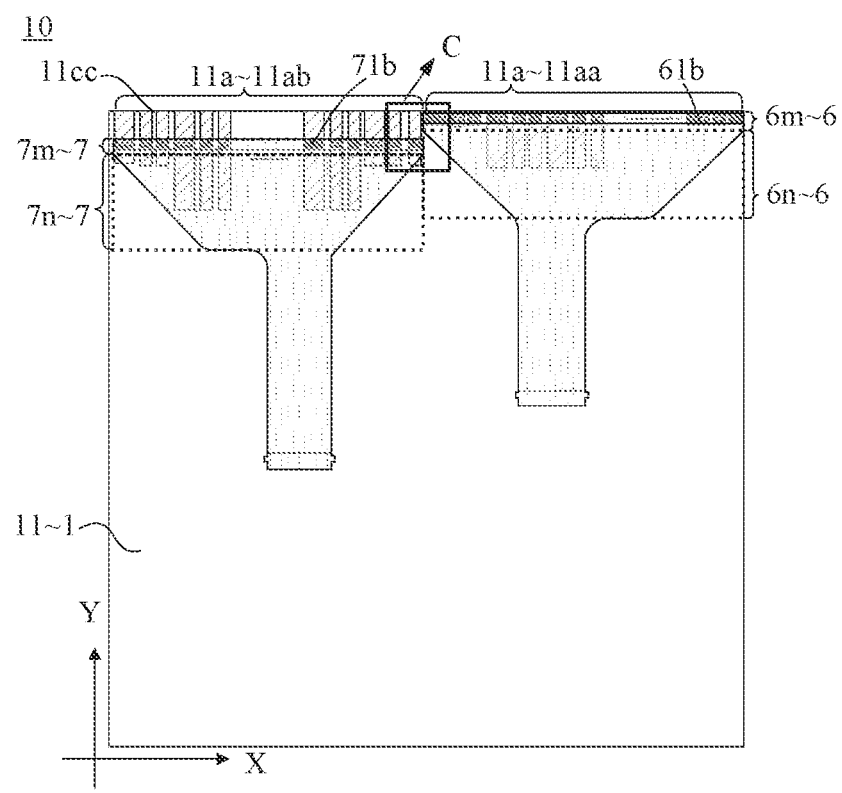
FIG. 12 is a structural diagram of another display module, in accordance with some embodiments of the present disclosure.
Figure 13:
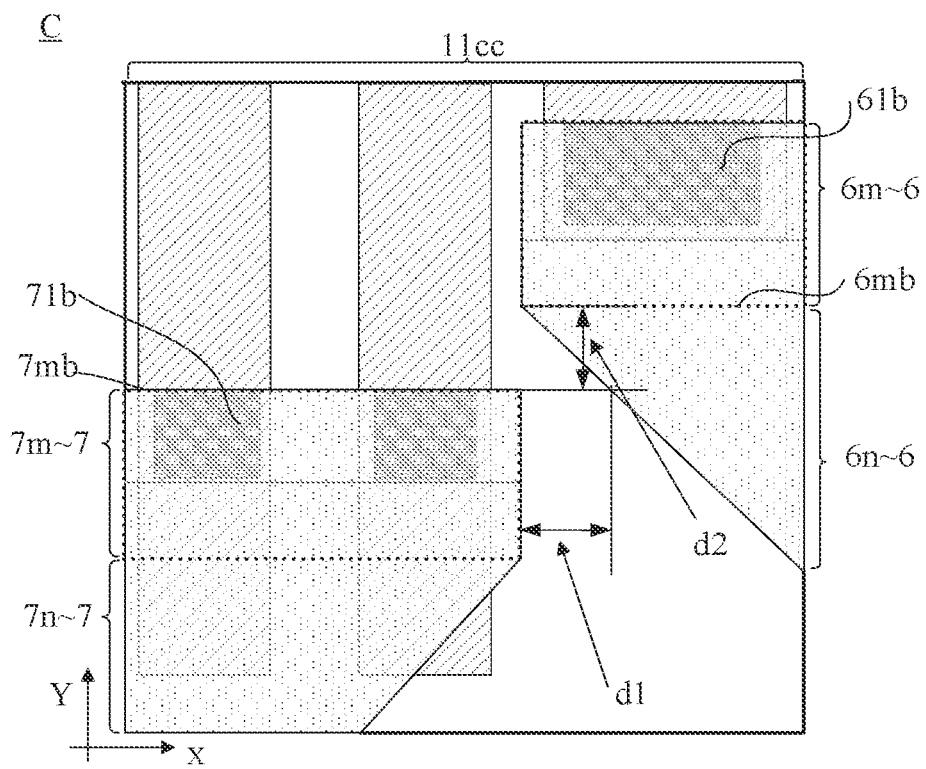
FIG. 13 is an enlarged view of the region C of the display module shown in FIG. 12, in accordance with some embodiments of the present disclosure.

In some embodiments, with reference to FIG. 6 again, the first flexible circuit board 6 proximate to the selected side edge 11cc is located on a left side of the display panel 1, and the second flexible circuit board 7 relatively away from the selected side edge 11cc is located on a right side of the display panel 1. The positions of the first flexible circuit board 6 and the second flexible circuit board 7 in a left-right direction are not limited thereto. In some other examples, as shown in FIGS. 12 and 13, the first flexible circuit board 6 proximate to the selected side edge 11cc is located on the right side of the display panel 1, and the second flexible circuit board 7 relatively away from the selected side edge 11cc is located on the left side of the display panel 1. The positions of the first flexible circuit board 6 and the second flexible circuit board 7 in the left-right direction are not limited, as long as it is satisfied that, the first wiring region 6m is closer to the selected side edge 11cc than the second wiring region 7m in the first direction Y, and the edge 6mb of the first wiring region 6m away from the selected side edge 11cc is closer to the selected side edge 11cc than the edge 7mb of the second wiring region 7m proximate to the selected side edge 11cc. The distance d2 between the second wiring region 7m and the first wiring region 6m is greater than 1 mm. For example, the distance d2 between the second wiring region 7m and the first wiring region 6m is 1.05 mm.

In addition, in the second direction X, the minimum distance d1-1 between the first fan-out region 6n and the second wiring region 7m is greater than 1 mm. For example, the minimum distance d1-1 between the first fan-out region 6n and the second wiring region 7m is 1.2 mm.

Figure 14:
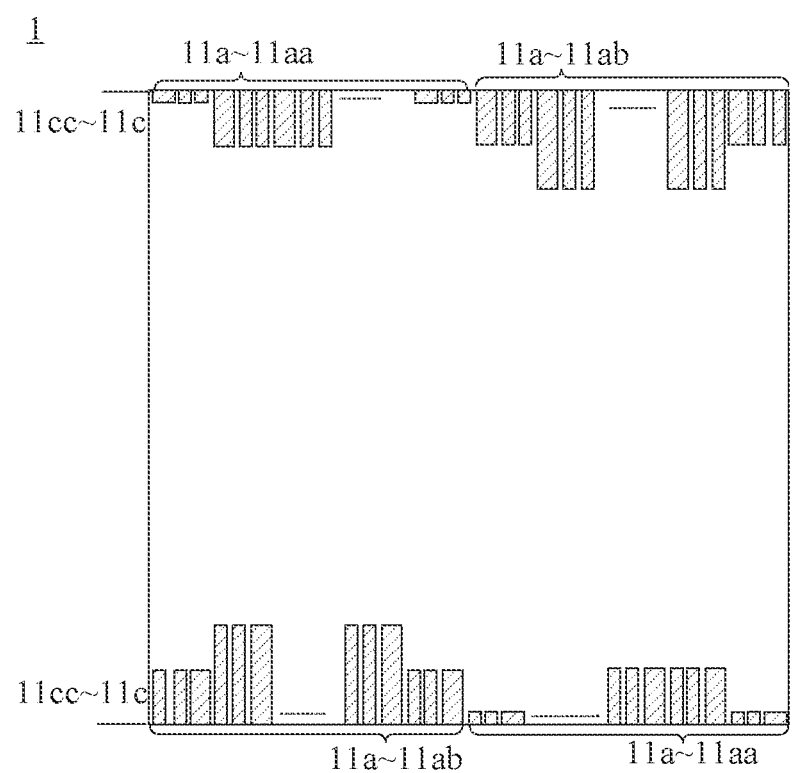
FIG. 14 is a structural diagram of another display panel, in accordance with some embodiments of the present disclosure.
Figure 15:
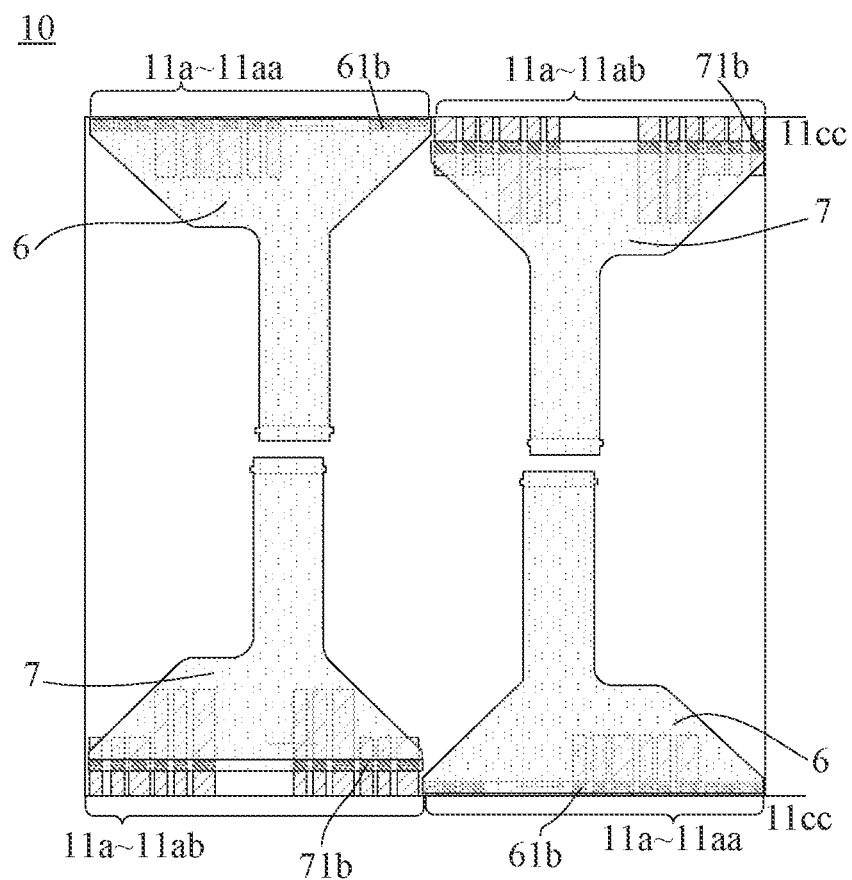
FIG. 15 is a structural diagram of yet another display module, in accordance with some embodiments of the present disclosure.

In some other embodiments, as shown in FIG. 14, two side edges 11c of the non-display surface 11 are selected side edges 11cc, the two selected side edges 11cc are disposed oppositely on the non-display surface 11 of the display panel 1, and the two selected side edges 11cc on the non-display surface 11 both have high requirements on tolerance specification of a flexible circuit board. In this case, bonding electrodes 11a along each selected side edge 11cc are divided into a first bonding electrode group 11aa and a second bonding electrode group 11ab. As shown in FIG. 15, for each selected side edge 11cc, bonding electrodes 11a in the first bonding electrode group 11aa are connected to corresponding first conductive contact pieces 61b of a first flexible circuit board 6, and bonding electrodes 11a in the second bonding electrode group 11ab are electrically connected to corresponding second conductive contact pieces 71b. For each selected side edge 11cc, left-right arrangement positions of the first flexible circuit board 6 and a second flexible circuit board 7 are determined depend on design requirements, which will not be detailed here.

Figure 16:
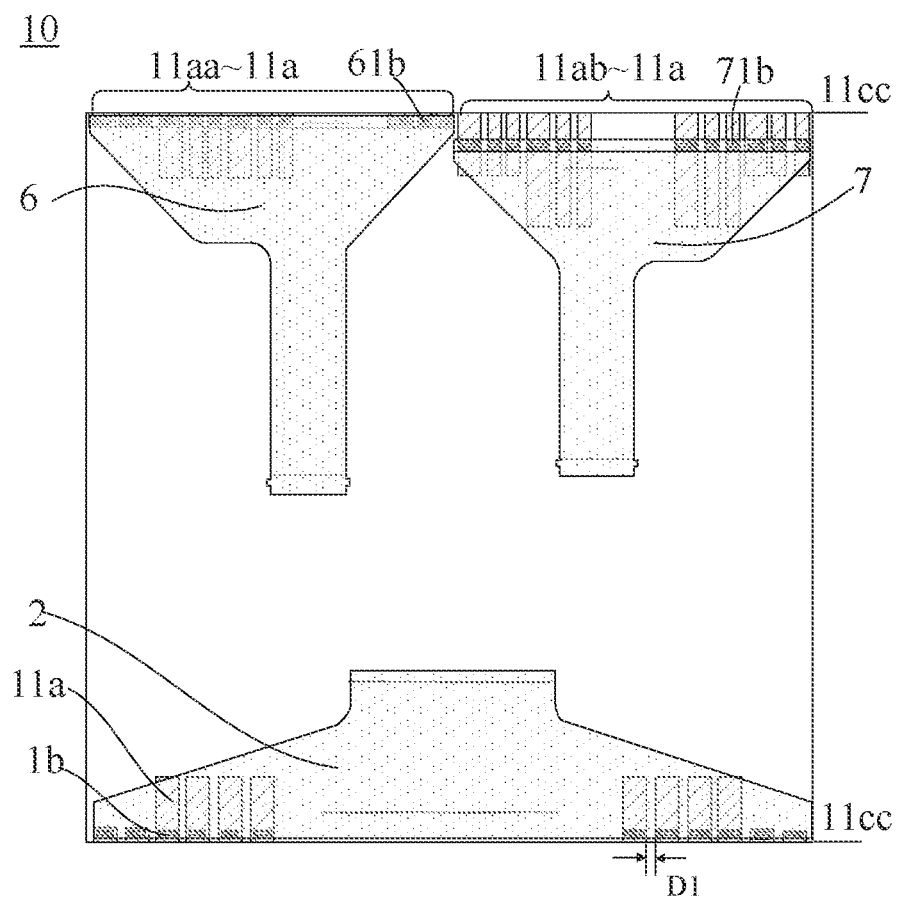
FIG. 16 is a structural diagram of yet another display module, in accordance with some embodiments of the present disclosure.

In yet some other embodiments, as shown in FIG. 16, two side edges 11c of the non-display surface 11 are selected side edges 11cc, the two selected side edges 11cc are arranged oppositely on the non-display surface 11 of the display panel 1, one of the selected side edges 11cc of the non-display surface 11 has high requirements on tolerance specification of a flexible circuit board, and the other of the selected side edges 11cc has low requirements on tolerance specification of a flexible circuit board. In this case, bonding electrodes 11a along the selected side edge 11cc which has the high requirements on tolerance specification of the flexible circuit board are divided into a first bonding electrode group 11aa and a second bonding electrode group 11ab, bonding electrodes 11a in the first bonding electrode group 11aa are connected to corresponding first conductive contact pieces 61b of the first flexible circuit board 6, and bonding electrodes 11a in the second bonding electrode group 11ab are electrically connected to corresponding second conductive contact pieces 71b; and bonding electrodes 11a along the selected side edge 11cc which has the low requirements on tolerance specification of the flexible circuit board are not divided, and in this case, references may be made to the bonding of the flexible circuit board 2 described above. The distance D1 between the bonding electrodes 11a is large, and the conductive contact pieces 1b in the flexible circuit board 2 with a large length may be bonded to corresponding bonding electrodes 11a, so that the connection of the circuits are completed.

Figure 17:
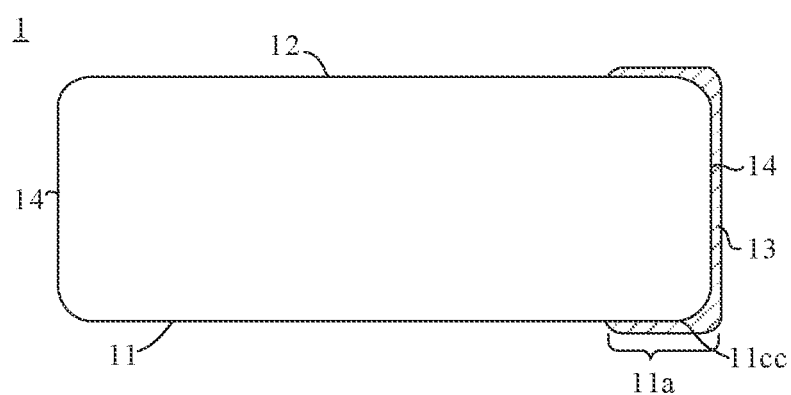
FIG. 17 is a side view of a display panel, in accordance with some embodiments of the present disclosure.

In some embodiments, as shown in FIG. 17, the display panel 1 further includes a display surface 12, a plurality of side surfaces 14 connecting the display surface 12 to the non-display surface 11. A side surface 14 proximate to the selected side edge 11cc is provided thereon with a plurality of side lines 13 that are arranged at intervals. An end of each side line 13 extending to the non-display surface 11 serves as one of the plurality of bonding electrodes 11a. Therefore, the bonding electrodes 11a along the selected side edge 11cc of the non-display surface 11 are portions of the side lines 13. For example, the bonding electrodes 11a are formed simultaneously when the side lines 13 are formed by a single-sided process.

In some embodiments, with reference to FIG. 7 again, the plurality of bonding electrodes 11a each extend in the first direction Y, and a minimum L3 of lengths of the bonding electrodes 11a in the first bonding electrode group 11aa in an extension direction thereof is less than a minimum L4 of lengths of the bonding electrodes 11a in the second bonding electrode group 11ab in an extension direction thereof. In order to electrically connect each first conductive contact piece 61b to a bonding electrode 11a in the first bonding electrode group 11aa and electrically connect each second conductive contact piece 71b to a bonding electrode 11a in the second bonding electrode group 11ab, the minimum of the lengths of the bonding electrodes 11a, which extends in the first direction Y, in the first bonding electrode group 11aa is less than the minimum of the lengths of the bonding electrodes 11a, which extends in the first direction Y, in the second bonding electrode group 11ab.

Figure 18A:
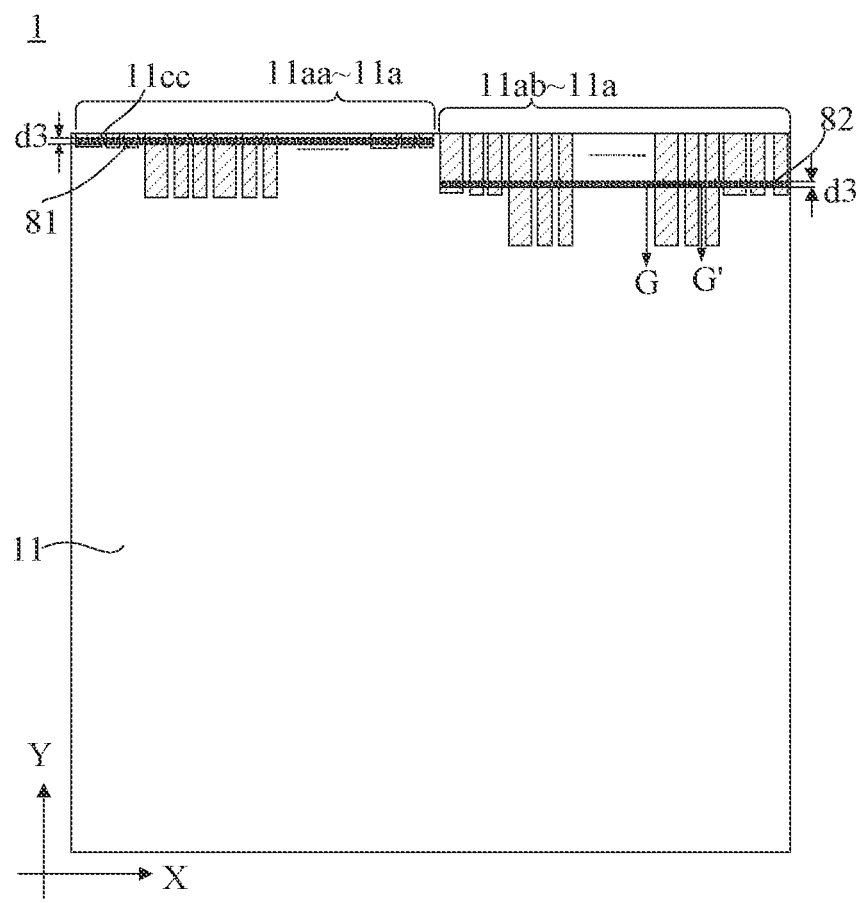
FIG. 18A is a structural diagram of yet another display panel, in accordance with some embodiments of the present disclosure.

In some embodiments, as shown in FIG. 18A, the non-display surface of the display panel 1 is further provided with a first adhesive film 81 and a second adhesive film 82. The plurality of first conductive contact pieces 61b correspond to the plurality of bonding electrodes 11a in the first bonding electrode group 11aa in a one-to-one manner. The first adhesive film 81 is located between the plurality of first conductive contact pieces 61b and the first bonding electrode group 11aa, and the first adhesive film 81 is in direct contact with the plurality of first conductive contact pieces 61b and the first bonding electrode group 11aa. The plurality of second conductive contact pieces 71b correspond to the plurality of bonding electrodes 11a in the second bonding electrode group 11ab in a one-to-one manner. The second adhesive film 82 is located between the plurality of second conductive contact pieces 71b and the second bonding electrode group 11ab, and the second adhesive film 82 is in direct contact with the plurality of second conductive contact pieces 71b and the second bonding electrode group 11ab. The first adhesive film 81 and the second adhesive film 82 each extend in the second direction X, and the first adhesive film 81 is closer to the selected side edge 11cc than the second adhesive film 82.

In some examples, with continued reference to FIG. 18A, one side edge 11c of the non-display surface 11 is the selected side edge 11cc. Portions of the bonding electrodes 11a in the first bonding electrode group 11aa for being bonded to the first conductive contact pieces 61b are each coated with the first adhesive film 81, and portions of the plurality of bonding electrodes 11a in the second bonding electrode group 11ab for being bonded to the plurality of second conductive contact pieces 71b are each coated with the second adhesive film 82. In order to realize the connection between the plurality of first conductive contact pieces 61b and the first bonding electrode group 11aa and the connection between the plurality of second conductive contact pieces 71b and the bonding electrodes 11a in the second bonding electrode group 11ab, the first adhesive film 81 and the second adhesive film 82 each extend in the second direction X, and the first adhesive film 81 is closer to the selected side edge 11cc than the second adhesive film 82. A structure of the display module 10 in which these structures are connected is as shown in FIG. 6.

Figure 18B:
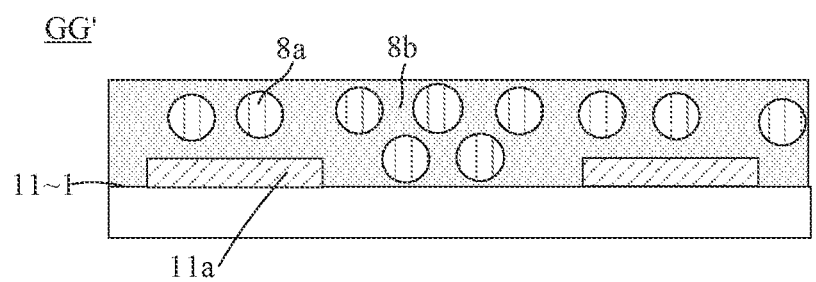
FIG. 18B is a section of the display panel shown in FIG. 18A taken along the GG', in accordance with some embodiments of the disclosure.

In some embodiments, as shown in FIG. 18B, both the first adhesive film 81 and the second adhesive film 82 include a plurality of conductive microspheres 8a and an insulator 8b. The plurality of conductive microspheres 8a are dispersed in the insulator 8b in a separated state. Conductive microspheres 8a and insulators 8b of the first adhesive film 81 and the second adhesive film 82 both have characteristics of bonding and deformation. For example, the first adhesive film 81 and the second adhesive film 82 may be anisotropic conductive adhesive films. A particle diameter of the conductive microsphere 8a is about 5 μm, and a density of the conductive microspheres 8a in the insulator 8b is about $2 \times 10^5/mm^2$. For example, the conductive microsphere 8a has a structure with gold and nickel included in a surface thereof and resin encased in an interior thereof. The conductive microspheres 8a will be crushed when subjected to a certain pressing force, so that metal particles in the conductive microspheres 8a will be embedded into the conductive contact pieces and/or the bonding electrodes to realize electrical connection therebetween.

Figure 18C:
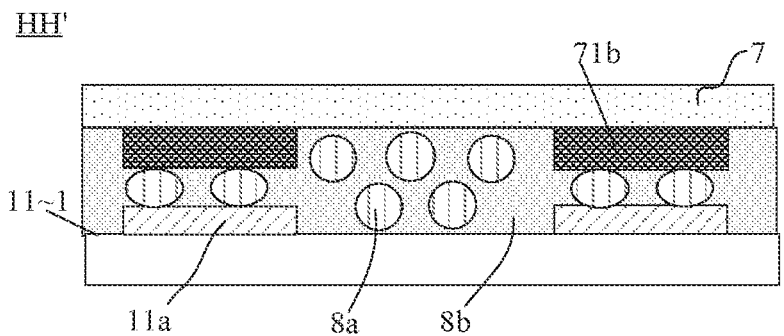
FIG. 18C is a section of the display module shown in FIG. 6 taken along the HH', in accordance with some embodiments of the disclosure.

In some embodiments, as shown in FIG. 18C, due to the characteristics of bonding and deformation of the conductive microspheres 8a and the insulators 8b of the first adhesive film 81 and the second adhesive film 82 and an conductive function of the conductive microspheres 8a, the first flexible circuit board 6 and the second flexible circuit board 7 are electrically connected to the plurality of bonding electrodes 11a. For example, after conductive microspheres 8a, between the bonding electrodes 11a and the second conductive contact pieces 71b, in the second adhesive film 82 are deformed by thermocompression, metal particles in the conductive microspheres 8a will be embedded into the conductive contact pieces and bonding electrodes, so that the bonding electrodes 11a are electrically connected to the second conductive contact pieces 71b. Since conductive microspheres 8a, between two adjacent bonding electrodes (or second conductive contact pieces), in the second adhesive film 82 are not subject to enough pressing force, the conductive microspheres 8a will not be crushed, this portion of the second adhesive film does not conduct electricity, and the adjacent bonding electrodes are electrically insulated from each other. For a structure and a conductive principle of the first adhesive film 81, reference may be made to the second adhesive film 82, which will not be repeated here.

It will be noted that, in order to realize the one-up-one-down dislocation bonding design of the first flexible circuit board 6 and the second flexible circuit board 7 on the non-display surface 11 of the display panel 1, the first adhesive film 81 is closer to the selected side edge 11cc than the adhesive film 82, and a minimum of lengths of the plurality of bonding electrodes 11a, which extend in the first direction Y, in the second bonding electrode group 11ab is greater than a minimum of lengths of the plurality of bonding electrodes 11a, which extend in the first direction Y, in the first bonding electrode group 11aa.

Figure 19:
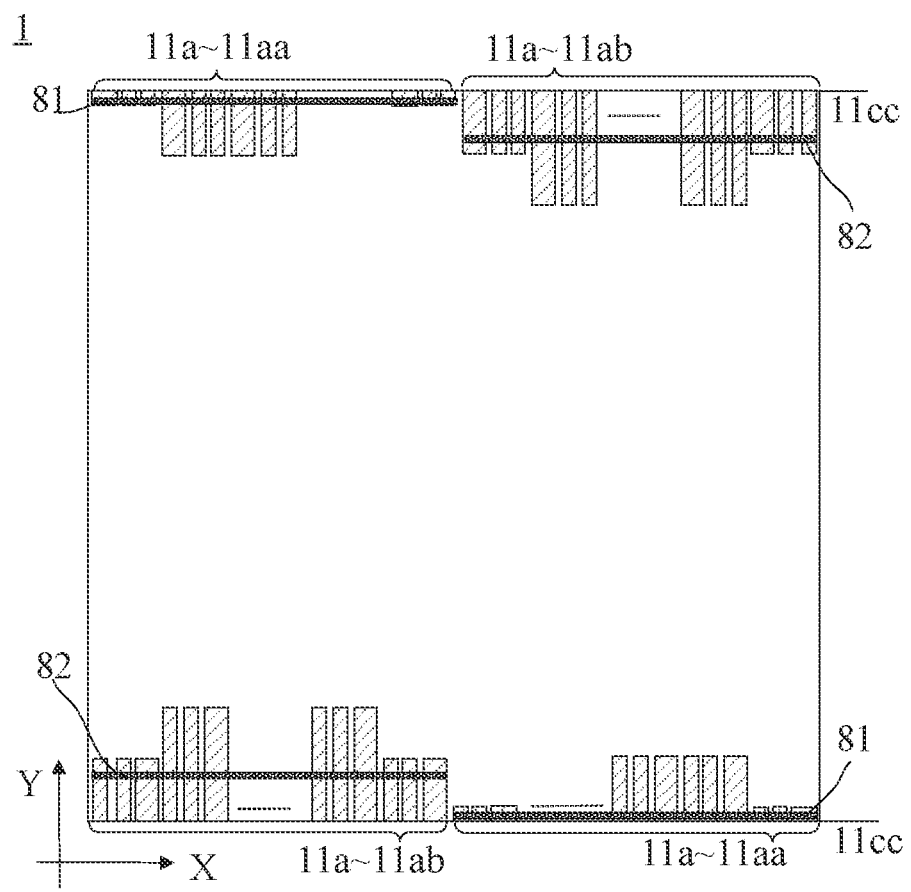
FIG. 19 is a structural diagram of yet another display panel, in accordance with some embodiments of the present disclosure.

In some other examples, as shown in FIG. 19, two side edges 11c of the non-display surface 11 are selected side edges 11cc. For each selected side edge 11cc, bonding electrodes 11a in a first bonding electrode group 11aa are used for being connected to corresponding first conductive contact pieces 61b of a first flexible circuit board 6, and bonding electrodes 11a in a second bonding electrode group 11ab is used for being electrically connected to corresponding second conductive contact pieces 71b; and for each selected side edge 11cc, portions of the bonding electrodes 11a in the first bonding electrode group 11aa for being bonded to the first conductive contact pieces 61b are each coated with a first adhesive film 81, and portions of the plurality of bonding electrodes in the second bonding electrode group 11ab for being bonded to the plurality of second conductive contact pieces 71b are each coated with a second adhesive film 82. A structure of the display module 10 in which these structures are connected is as shown in FIG. 15.

In addition, for each selected side edge 11cc, the first adhesive film 81 is closer to the selected side edge 11cc than the second adhesive film 82.

Figure 20:
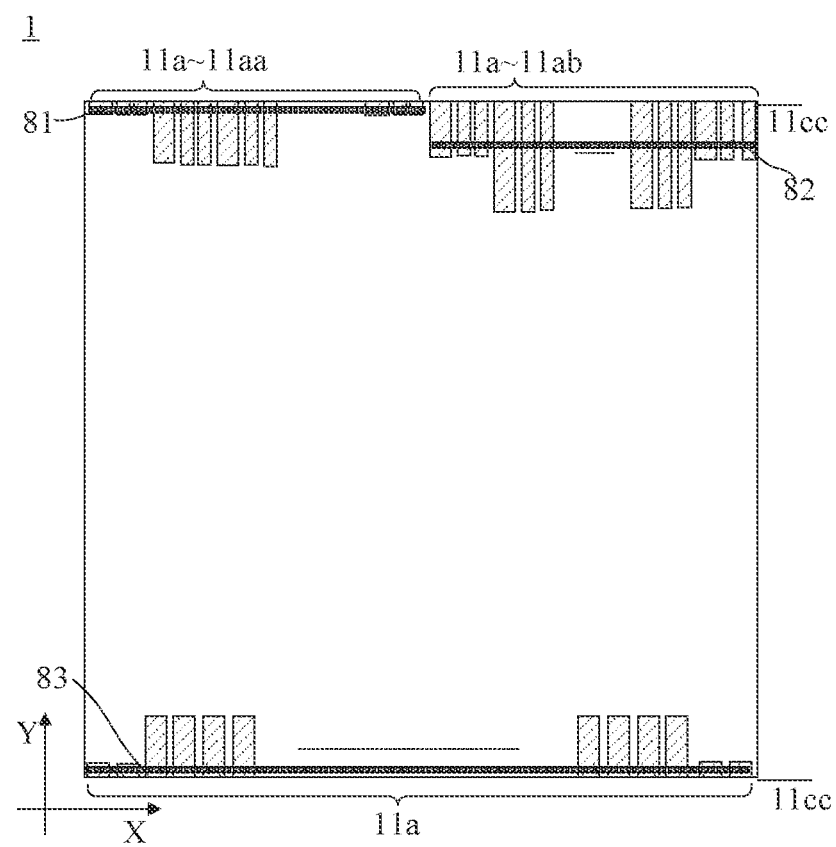
FIG. 20 is a structural diagram of yet another display panel, in accordance with some embodiments of the present disclosure.

In yet some other examples, as shown in FIG. 20, two side edges 11c of the non-display surface 11 are selected side edges 11cc, the two selected side edges 11cc are disposed opposite to each other on the non-display surface 11 of the display panel 1, one of the selected side edges 11cc of the non-display surface 11 has high requirements on tolerance specification of a flexible circuit board, and the other of the selected side edges 11cc of the non-display surface 11 selected side edge 11cc has low requirements on tolerance specification of a flexible circuit board. In this case, bonding electrodes 11a along the selected side edge 11cc which has the high requirements on tolerance specification of the flexible circuit board are divided into a first bonding electrode group 11aa and a second bonding electrode group 11ab, and bonding electrodes 11a in the first bonding electrode group 11aa are used for being electrically connected to first conductive contact pieces 61b of the first flexible circuit board 6 in one-to-one correspondence; and bonding electrodes 11a in the second bonding electrode group 11ab are used for being electrically connected to second conductive contact pieces 71b in one-to-one correspondence. Bonding electrodes 11a along the selected side edge 11cc which has the low requirements on tolerance specification of the flexible circuit board are not divided, and then conductive contact pieces 1b of a flexible circuit board 2 with a large length may be used to be connected to corresponding bonding electrodes 11a subsequently. A structure of the display module 10 in which these structures are connected is as shown in FIG. 16. For example, portions of the bonding electrodes 11a in the first bonding electrode group 11aa for being bonded to the conductive contact pieces 61b are each coated with a first adhesive film 81, portions of the plurality of bonding electrodes 11a in the second bonding electrode group 11ab for being bonded to the plurality of second conductive contact pieces 71b are each coated with a second adhesive film 82, and portions of bonding electrodes 11a for being connected to conductive contact pieces 1b of a flexible circuit board 2 are each coated with a third adhesive film 83.

In some embodiments, with reference to FIGS. 18A, 19 and 20 again, a requirement for extension lengths of the first adhesive film 81 and the second adhesive film 82 in the second direction X is that, a length of the first adhesive film 81 as a whole is approximately equal to an arrangement length of the plurality of bonding electrodes 11a in the first bonding electrode group 11aa, and a length of the second adhesive film 82 as a whole is approximately equal to an arrangement length of the plurality of bonding electrodes 11a in the second bonding electrode group 11ab, so that it is ensured that each bonding electrode 11a is coated with an adhesive film thereon. Similarly, an extension length of the third adhesive film 83 in the second direction X is approximately equal to an arrangement length of the plurality of bonding electrodes 11a along the selected side edge 11cc coated with the third adhesive film 83 in the second direction X, so that it is ensured that each bonding electrode 11a is coated with an adhesive film layer.

In some embodiments, with continued reference to FIG. 18A again, widths of the first adhesive film 81 and the second adhesive film 82 in the first direction Y are in a range of 1 mm to 1.5 mm, inclusive. For example, the widths of the first adhesive film 81 and the second adhesive film 82 in the first direction Y are 1 mm; alternatively, a width of the first adhesive film 81 in the first direction Y is 1.2 mm, and a width of the second adhesive film 82 in the first direction Y is 1.5 mm.

Figure 21:
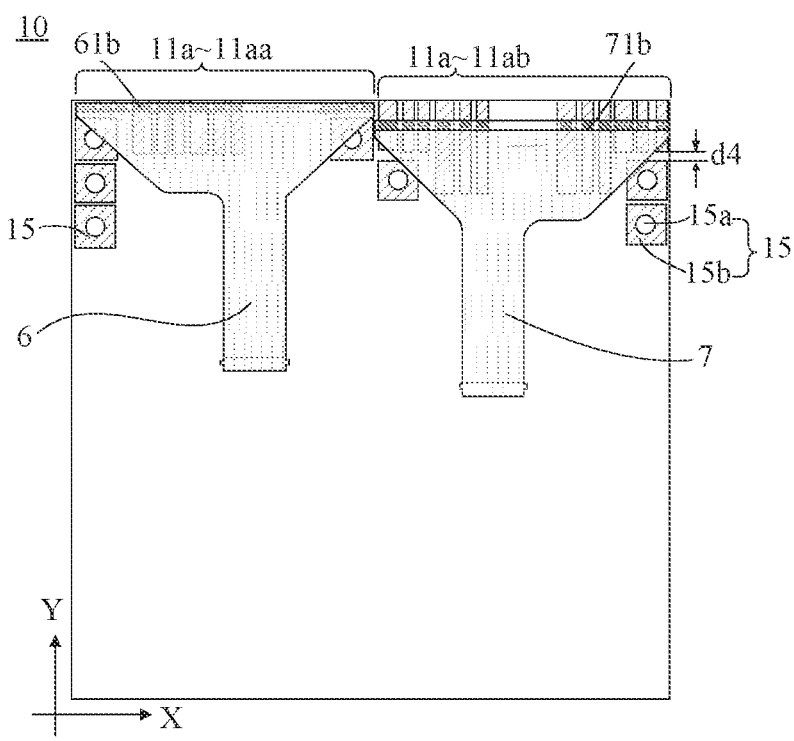
FIG. 21 is a structural diagram of yet another display module, in accordance with some embodiments of the present disclosure.

In some embodiments, as shown in FIG. 21, the non-display surface 11 of the display panel 1 is further provided thereon with at least one alignment mark 15. The at least one alignment mark 15 is used for an alignment between the plurality of the first conductive contact pieces 61b and the bonding electrodes 11a in the first bonding electrode group 11aa and an alignment between the plurality of second conductive contact pieces 71b and the bonding electrodes 11a in the second bonding electrode group 11ab during connection. In a process of manufacturing the display module 10, in order to realize the connection between the first conductive contact pieces 61b and corresponding bonding electrodes 11a and the connection between the second conductive contact pieces 71b and corresponding bonding electrodes 11a, the alignment mark 15 need to be used for identification, so that an accurate alignment of the flexible circuit boards is completed when the flexible circuit boards are attached.

In some embodiments, with continued reference to FIG. 21 again, the alignment mark 15 includes a mark pattern 15a and a clearance region 15b disposed around the mark pattern 15a. The clearance region 15b is insulated from a region around the clearance region 15b, and the alignment mark 15 is separated from a bonding electrode adjacent thereto, so that the clearance region 15b is insulated from the region around the clearance region 15b. The mark pattern 15a may be in a shape of a circle or a cross. The clearance region 15b may be in a shape of a circle or a square. In some examples, as shown in FIG. 21, the mark pattern 15a is circular, the clearance region 15b surrounding the mark pattern 15a is square, and the clearance region 15b and a bonding electrode 11a adjacent thereto have a distance d4 therebetween, so that the clearance region 15b is kept insulated from the region around the clearance region 15b, which avoids an influence of lines around on identification and alignment, and then improves accuracy of alignment. In a case where the clearance region 15b is square, a side length of the clearance region 15b is greater than 300 μm. For example, the side length of the clearance region 15b is 350 μm.

Figure 22:
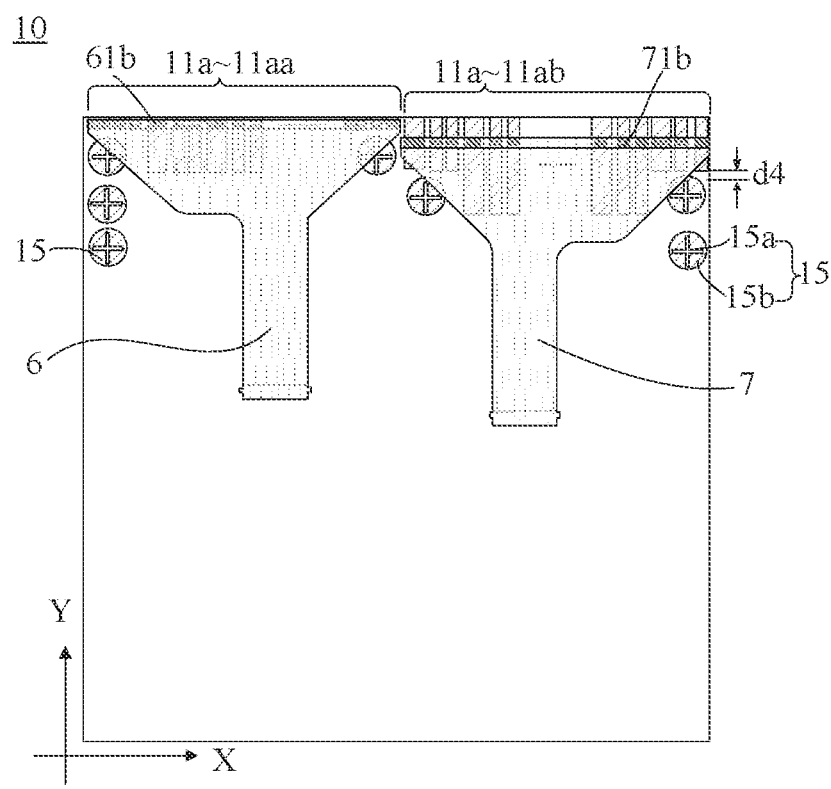
FIG. 22 is a structural diagram of yet another display module, in accordance with some embodiments of the present disclosure.

In some examples, as shown in FIG. 22, the mark pattern 15a is cross-shaped, and the clearance region 15b surrounding the mark pattern 15a is circular. In a case where the clearance region 15b is circular, a diameter of the clearance region 15b is greater than 300 μm. For example, the diameter of the clearance region 15b is 320 μm.

It will be noted that, the shape of the mark pattern 15a may be selected from a circle, a cross and other shapes depend on needs, and the shape of the clearance region 15b may be a circle, a square or other shapes, as long as an identifiable alignment function may be realized.

In addition, it will be noted that, alignment marks 15 are enlarged in order to clearly show approximate structures and approximate positions of the alignment marks in FIGS. 21 and 22.

Figure 23:
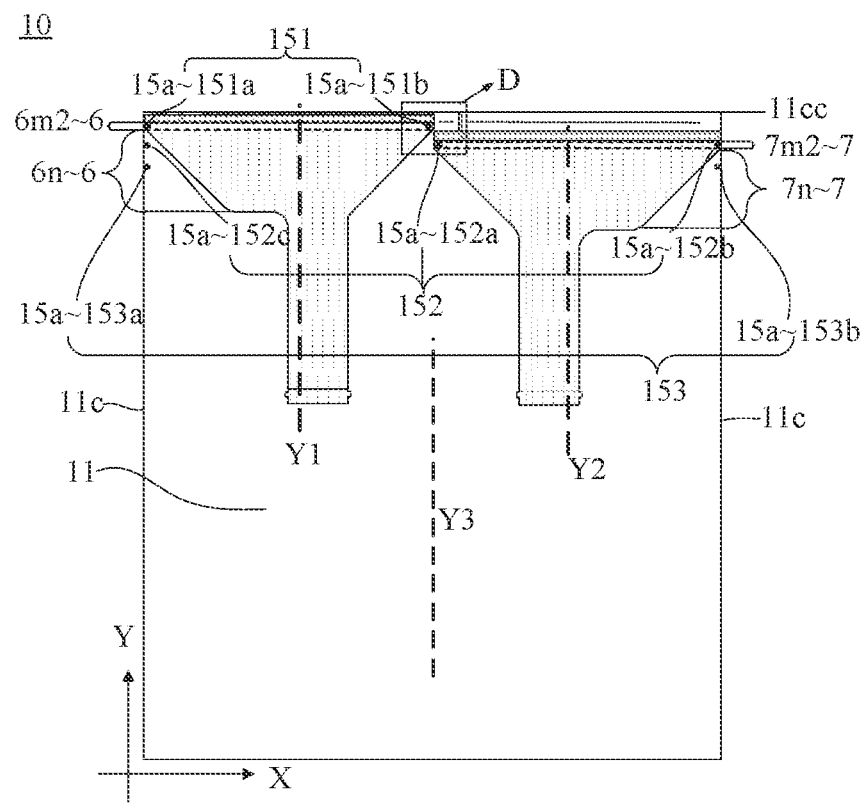
FIG. 23 is a structural diagram of yet another display module, in accordance with some embodiments of the present disclosure.

In some embodiments, as shown in FIG. 23, the at least one alignment mark 15 includes a plurality of alignment marks 15. The plurality of alignment marks 15 include a first alignment mark group 151, a second alignment mark group 152 and a third alignment mark group 153 that are arranged at intervals in the first direction Y.

Figure 24:
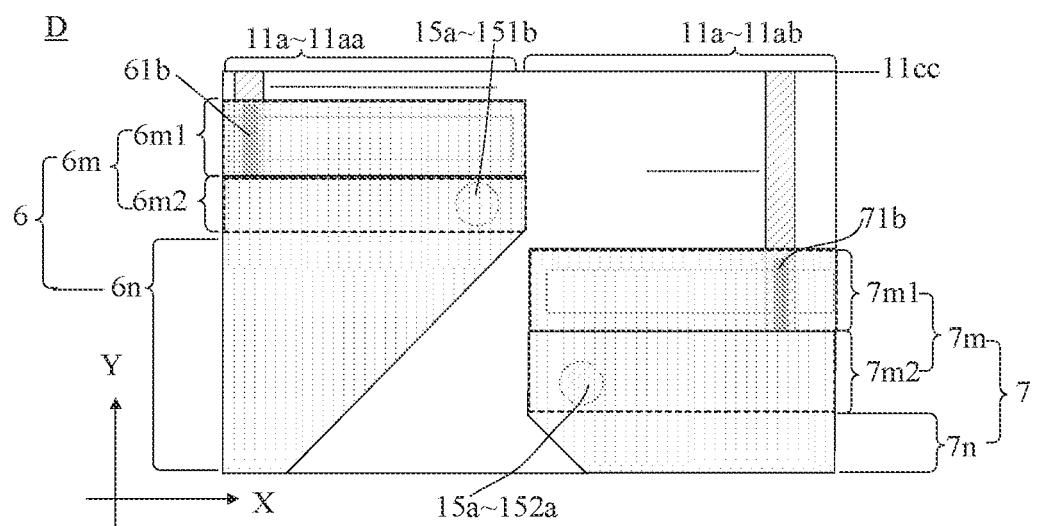
FIG. 24 is an enlarged view of the region D of the display module shown in FIG. 23, in accordance with some embodiments of the present disclosure.

In some embodiments, as shown in FIG. 24, the first wiring region 6m of the first flexible circuit board 6 includes a first bonding region 6m1 and a first alignment mark region 6m2 that are arranged in the first direction Y. The first alignment mark region 6m2 is connected to the first fan-out region 6n, and the plurality of first conductive contact pieces 61b are disposed in the first bonding region 6m1. The second wiring region 7m of the second flexible circuit board 7 includes a second bonding region 7m1 and a second alignment mark region 7m2 that are arranged in the first direction Y. The second alignment mark region 7m2 is connected to the second fan-out region 7n, and the plurality of second conductive contact pieces 71b are disposed in the second bonding region 7m1.

In some embodiments, with continued reference to FIG. 23 again, the first alignment mark group 151 includes a first alignment sub-mark 151a and a second alignment sub-mark 151b. A mark pattern 15a of the first alignment sub-mark 151a and a mark pattern 15a of the second alignment sub-mark 151b are located within an orthographic projection of the first alignment mark region 6m2 on the non-display surface 11, and the mark pattern 15a of the first alignment sub-mark 151a is symmetrical with the mark pattern 15a of the second alignment sub-mark 151b with respective to a center line Y1 of the orthographic projection of the first alignment mark region 6m2 on the non-display surface 11 in the first direction Y. For example, the mark pattern 15a of the first alignment sub-mark 151a and the mark pattern 15a of the second alignment sub-mark 151b are located at positions in the orthographic projection of the first alignment mark region 6m2 of the non-display surface 11 that are proximate to two ends of the orthographic projection in the second direction X. The first alignment sub-mark 151a is closer to a side edge 11c of the non-display surface 11 than the second alignment sub-mark 151b.

In some embodiments, as shown in FIG. 23, the second alignment mark group 152 includes a third alignment sub-mark 152a, a fourth alignment sub-mark 152b and a fifth alignment sub-mark 152c. A mark pattern 15a of the third alignment sub-mark 152a and a mark pattern 15a of the fourth alignment sub-mark 152b are located within an orthographic projection of the second alignment mark region 7m2 on the non-display surface 11, and the mark pattern 15a of the third alignment sub-mark 152a is symmetrical with the mark pattern 15a of the fourth alignment sub-mark 152b with respect to a center line Y2 of the orthographic projection of the second alignment mark region 7m2 on the non-display surface 11 in the first direction Y. The fourth alignment sub-mark 152b is closer to another side edge 11c of the non-display surface 11 than the third alignment sub-mark 152a. A center of the fifth alignment sub-mark 152c, a center of the third alignment sub-mark 152a and a center of the fourth alignment sub-mark 152b are located on a same line in the second direction X. A mark pattern 15a of the fifth alignment sub-mark 152c is located on a side of an orthographic projection of the first fan-out region 6n on the non-display surface 11 in the second direction X.

In some embodiments, with continued reference to FIG. 23 again, the third alignment mark group 153 includes a sixth alignment sub-mark 153a and a seventh alignment sub-mark 153b. The sixth alignment sub-mark 153a is symmetrical with the seventh alignment sub-marks 153b with respect to a center line Y3 of the non-display surface 11 in the second direction X. A mark pattern 15a of the seventh alignment sub-mark 153b is located on a side of an orthographic projection of the second fan-out region 7n on the non-display surface 11 in the second direction Y.

In some examples, when the flexible circuit boards are bonded to the bonding electrodes 11a, with reference to FIGS. 23 and 18A again, the portions of the bonding electrodes 11a in the first bonding electrode group 11aa for being bonded to the first conductive contact pieces 61b are each coated with the first adhesive film 81, and the portions of the bonding electrodes 11a in the second bonding electrode group 11ab for being bonded to the plurality of the second conductive contact pieces 71b are each coated with the second adhesive film 82. It will be understood that, a pair of alignment marks 15 that are symmetrical with each other with respect to the center line Y3 of the non-display surface 11 in the second direction X may be used for aligning of the adhesive films. The sixth alignment sub-mark 153a and the seventh alignment sub-mark 153b are used for alignment before coating. The sixth alignment sub-mark 153a is symmetrical with the seventh alignment sub-mark 153b with respect to the center line Y3 of the non-display surface 11 in the second direction X, so that the sixth alignment sub-mark 153a and the seventh alignment sub-mark 153b may play a role of identification and alignment. Since the fourth alignment sub-mark 152b is also symmetrical with the fifth alignment sub-mark 152c with respect to the center line Y3 of the non-display surface 11 in the second direction X, and the role of identification and alignment of the alignment marks 15 becomes better as the alignment marks 15 approaches a region to be coated, the fourth alignment sub-mark 152b and the fifth alignment sub-mark 152c may be further used for alignment before coating of the first adhesive film 81 and the second adhesive film 82.

It will be understood that, a pair of alignment marks, i.e., the third alignment sub-mark 152a and the fourth alignment sub-mark 152b, arranged symmetrically with respect to the center line Y2 of the orthographic projection of the second alignment mark region 7m2 on the non-display surface 11 in the first direction Y may be used for alignment of the second flexible circuit board 7. In some examples, with continued reference to FIG. 23 again, by identifying the third alignment sub-mark 152a and the fourth alignment sub-mark 152b, the second conductive contact pieces 71b of the second flexible circuit board 7 are aligned with the bonding electrodes 11a in the bonding electrode group 11ab in one-to-one correspondence.

It will be understood that, a pair of alignment marks, i.e., the first alignment sub-mark 151a and the second alignment sub-mark 151b, arranged symmetrically with respect to the center line Y1 of the orthographic projection of the first alignment mark region 6m2 on the non-display surface 11 in the first direction Y may be used for alignment of the first flexible circuit board 6. In some examples, with continued reference to FIG. 23 again, by identifying the first alignment sub-mark 151a and the second alignment sub-mark 151b, the first conductive contact pieces 61b of the first flexible circuit board 6 are aligned with the bonding electrodes 11a in the first bonding electrode group 11aa in one-to-one correspondence.

In some examples, with continued reference to FIG. 23 again, through a pair of alignment marks 15 that are symmetrically arranged with respect to the center line Y3 of the non-display surface 11 in the second direction X, the attached first flexible circuit board 6 and the attached second flexible circuit board 7 are pre-pressed. With reference to FIG. 18C again, in each of spaces where the first conductive contact pieces 61b and the second conductive contact pieces 71b are opposite to the bonding electrodes 11a in a direction perpendicular to the non-display surface 11 of the display panel 1, conductive microspheres 8a of the adhesive films are crushed, and metal particles of the conductive microspheres 8a are embedded into the first conductive contact pieces 61b, the second conductive contact pieces 71 and the bonding electrodes 11a, so that electrical communications therebetween are realized. It will be noted that, since the attached second flexible circuit board 7 covers the fourth alignment sub-mark 152b, an alignment of an alignment system is performed through the sixth alignment sub-mark 153a and the seventh alignment sub-mark 153b symmetrically arranged with respect to the center line Y3 of the non-display surface 11 in the second direction X, and then the first flexible circuit board 6 and the second flexible circuit board 7 are stably and firmly connected to the bonding electrodes 11a by hot pressing at a temperature ranging from 130° C. to 150° C.

Figure 25:
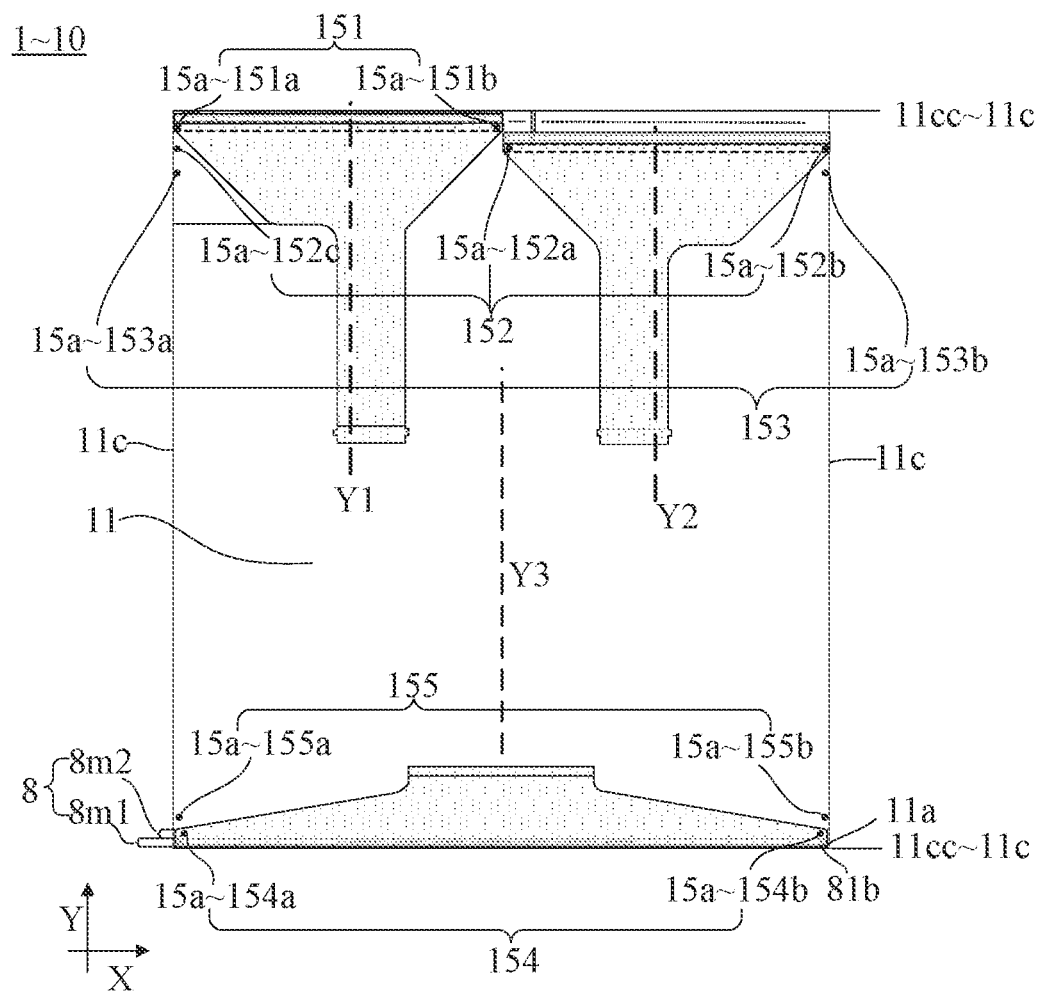
FIG. 25 is a structural diagram of yet another display module, in accordance with some embodiments of the present disclosure.

In some embodiments, as shown in FIG. 25, two side edges 11c of the non-display surface 11 are selected sides 11cc, one of the selected side edges 11cc of the non-display surface 11 has high requirements on tolerance specification of a flexible circuit board, and the other selected side edge 11cc has low requirements on tolerance specification of a flexible circuit board. In this case, the selected side edge 11cc that has the high requirements on tolerance specification of the flexible circuit board may be provided with the first alignment mark group 151, the second alignment mark group 152 and the third alignment mark group 153 according to the above content, so that the first flexible circuit board 6 and the second flexible circuit board 7 are bonded to the display panel 1, which will not be repeated here. The selected side edge 11cc has the low requirements on the tolerance specification of the flexible circuit board may be provided with corresponding alignment marks 15 for identification and alignment, so that a flexible circuit board is accurately aligned with and bonded to the display panel.

In some examples, with continued reference to FIG. 25 again, a tolerance of the third flexible circuit board 8 with a large length meets bonding requirements of one of the selected side edges 11cc. The third flexible circuit board 8 includes a third bonding region 8m1 and a third alignment mark region 8m2 that are arranged in the first direction Y. The third bonding region 8m1 is closer to the selected side edge 11cc for bonding, and provide therein with a plurality of third conductive contact pieces 81b. The third contact pieces 81b are used for being connected with corresponding bonding electrodes 11a along the selected side edge 11cc for bonding. A fourth alignment mark group 154 and a fifth alignment mark group 155 are provided at intervals in the first direction Y for identification, alignment and bonding of the third flexible circuit board 8. The fourth alignment mark group 154 includes an eighth alignment sub-mark 154a and a ninth alignment sub-mark 154b that are arranged at intervals in the second direction X. A mark pattern 15a of the eighth alignment sub-mark 154a and a mark pattern 15a of the ninth alignment sub-mark 154b are located within an orthographic projection of the third alignment mark region 8m2 on the non-display surface 11, and the mark pattern 15a of the eighth alignment sub-mark 154a is symmetrical with the mark pattern 15a of the ninth alignment sub-mark 154b with respect to the center line Y3 of the non-display surface 11 in the second direction X. The fifth alignment mark group 155 includes a tenth alignment sub-mark 155a and an eleventh alignment sub-mark 155b. The tenth alignment sub-mark 155a is symmetrical with the eleventh alignment sub-mark 155b with respect to the center line Y3 of the non-display surface 11 in the second direction X, and orthographic projections of the tenth alignment sub-mark 155a and the eleventh alignment sub-mark 155b do not overlap with an orthographic projection of the third flexible circuit board 8 on the non-display surface 11.

In some examples, with continued reference to FIG. 25 again, like the eighth alignment sub-mark 154a and the ninth alignment sub-mark 154b, the tenth alignment sub-mark 155a and the eleventh alignment sub-mark 155b are also symmetrical with each other with respect to the center line Y3 of the non-displayed surface 11 in the second direction X. Therefore, the eighth alignment sub-mark 154a and the ninth alignment sub-mark 154b, as well as the tenth alignment sub-mark 155a and the eleventh alignment sub-mark 155b, may all be used for attachment and alignment of the third adhesive film 83. An attachment position of the third adhesive film 83 is as shown in FIG. 20, which will not be detailed here. Since the role of identification and alignment of the alignment marks becomes better as the alignment marks 15 approaches a region to be coated, the eighth alignment sub-mark 154a and the ninth alignment sub-mark 154b may be used for alignment of the third adhesive film 83 before coating. Since the mark pattern 15a of the eighth alignment sub-mark 154a and the mark pattern 15a of the ninth alignment sub-mark 154b are located within the orthographic projection of the third alignment mark region 8m2 on the non-display surface 11, the third flexible circuit 8 will prevent the alignment system from identifying the mark pattern 15a of the eighth alignment sub-mark 154a and the mark pattern 15a of the ninth alignment sub-mark 154b when the third flexible circuit board 8 is attached. In this case, the tenth alignment sub-mark 155a and the eleventh alignment sub-mark 155b whose orthographic projections on the non-display surface 11 do not overlap with the orthographic projection of the third flexible circuit board 8 on the non-display surface 11 are used for identification and alignment of the third flexible circuit board 8, and then pre-pressing and main pressing are performed to realize alignment and bonding of the third flexible circuit board 8.

It will be understood that, in a case where positions of the first flexible circuit board 6 and the second flexible circuit board 7 need to be reversed in the second direction X, the first alignment mark group 151, the second alignment mark group 152 and the third alignment mark group 153 are disposed at corresponding positions depend on functions of respective alignment marks 15, which will not be detailed here. In a case where two side edges 11c of the non-display surface 11 are selected sides 11cc, and both selected side edges 11cc of the non-display surface 11 have high requirements on tolerance specification of a flexible circuit board, the alignment marks need to be arranged by considering respective first flexible circuit boards 6 and respective second flexible circuit boards 7 to be bonded, which will not be detailed here.

Figure 26:
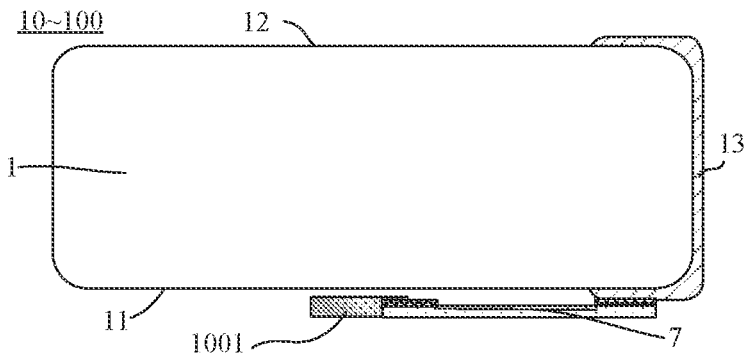
FIG. 26 is a structural diagram of a display device, in accordance with some embodiments of the present disclosure.

Some embodiments of the present disclosure provide a display device 100. As shown in FIG. 26, the display device 100 includes the display module 10 and a driver 1001 electrically connected to the display module 10. The driver 1001 is disposed at the non-display surface 11 of the display panel 1. The plurality of third conductive contact pieces 661b of the first flexible circuit board 6 and the plurality of fourth conductive contact pieces 771b of the second flexible circuit board 7 are electrically connected to the driver 1001. The driver 1001 is used for signal transmission of the display device 100.

Beneficial effects achieved by the display device 100 are same as the beneficial effects achieved by the display module 10 provided by a first aspect of the present disclosure, which will not be repeated here.

Figure 27:
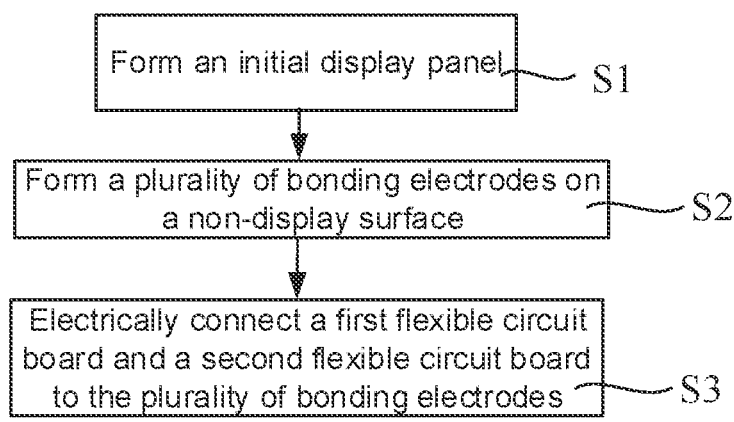
FIG. 27 is a flowchart of a method for manufacturing a display module, in accordance with some embodiments of the present disclosure.

Some embodiments of the present disclosure provide a method for manufacturing a display module. The method is used for manufacturing the display module 10 described above. As shown in FIG. 27, the method includes the following steps.

Figure 28:
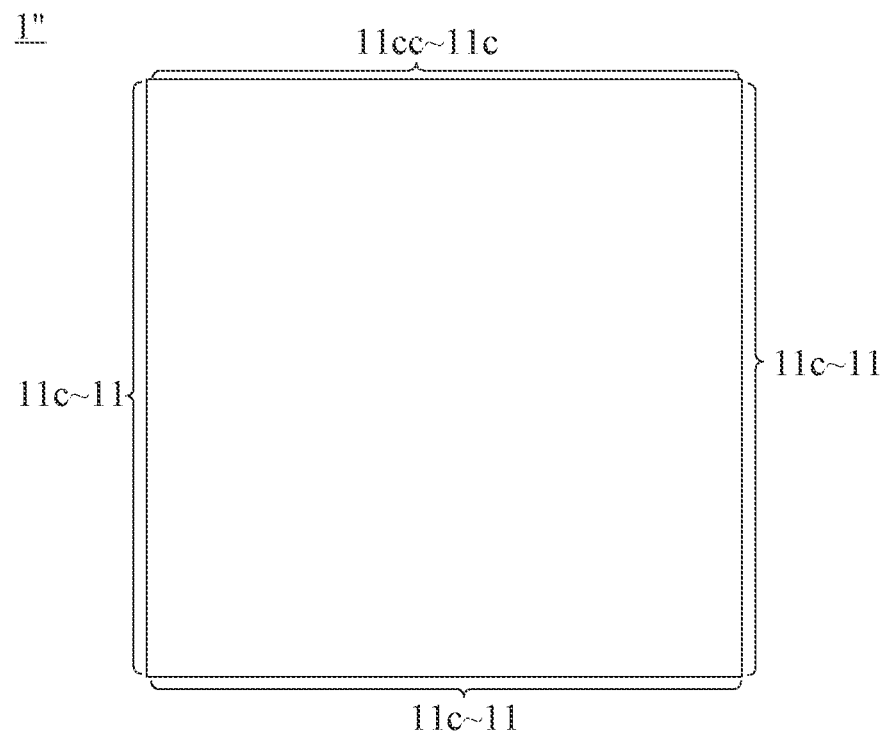
FIG. 28 is a structural diagram of an initial display panel, in accordance with some embodiments of the present disclosure.

In a step S1, an initial display panel 1" is formed. As shown in FIG. 28, the non-display surface 11 of the initial display panel 1" includes the plurality of side edges 11c, and the at least one side edge 11c is the selected side edge 11cc.

The initial display panel 1" refers to a display panel provided with film layers on the display surface 12. The film layers of the display surface 12 include all of signal lines, power supply lines, control lines, etc.

In a step S2, the plurality of bonding electrodes 11a are formed on the non-display surface 11. With reference to FIG. 7 again, the plurality of bonding electrodes 11a are sequentially arranged at intervals along the selected side edge 11cc and divided into the first bonding electrode group 11aa and the second bonding electrode group 11ab. The first bonding electrode group 11aa includes the portion of the plurality of bonding electrodes 11a, and the second bonding electrode group 11ab includes the other portion of the plurality of bonding electrodes 11a.

It will be noted that, after the plurality of bonding electrodes 11a are formed, the initial display panel 1" with the plurality of bonding electrodes 11a becomes the display panel 1 of the present disclosure.

In some embodiments, with continued reference to FIG. 7, one side edge 11c of the display panel 1 is the selected side edge 11cc, and the plurality of bonding electrodes 11a on the non-display surface 11 of the display panel 1 are formed along the selected side edge 11cc.

In a step S3, the first flexible circuit board 6 and the second flexible circuit board 7 are electrically connected to the plurality of bonding electrodes 11a. As shown in FIGS. 6 and 8, the first flexible circuit board 6 includes the first wiring region 6m and the first fan-out region 6n that are connected to each other. The first wiring region 6m is closer to the selected side edge 11cc than the first fan-out region 6n. The first wiring region 6m is provided therein with the plurality of first conductive contact pieces 61b that are arranged at intervals, and each first conductive contact piece 61b is electrically connected to a bonding electrode 11a in the first bonding electrode group 11aa. As shown in FIGS. 6 and 9, the second flexible circuit board 7 includes the second wiring region 7m and the second fan-out region 7n that are connected to each other, and the second wiring region 7m is closer to the selected side edge 11cc than the second fan-out region 7n. The second wiring region 7m is provided therein with the plurality of second conductive contact pieces 71b that are arranged at intervals, and each of the second conductive contact pieces 71b is electrically connected to a bonding electrode 11a in the second bonding electrode group 11ab. Thus, the display module 10 is obtained.

For example, the structure of the display module 10 is as shown in FIG. 6.

In some embodiments, as shown in FIGS. 6 and 10, in the first direction Y, the first wiring region 6m is closer to the selected side edge 11cc than the second wiring region 7m. With continued reference to FIG. 10 again, the entire of the first wiring region 6m is closer to the selected side edge 11cc than the entire of the second wiring region 7m. In addition, as shown in FIGS. 6 and 11, in the second direction X, the first fan-out region 6n and the second wiring region 7m have the distance d1 therebetween. The first direction Y is perpendicular to the second direction X, and the second direction X is the extension direction of the selected side edge 11cc. The orthographic projection of the first flexible circuit board 6 on the display panel 1 does not overlap with the orthographic projection of the second flexible circuit board 7 on the display panel 1.

Figure 29:
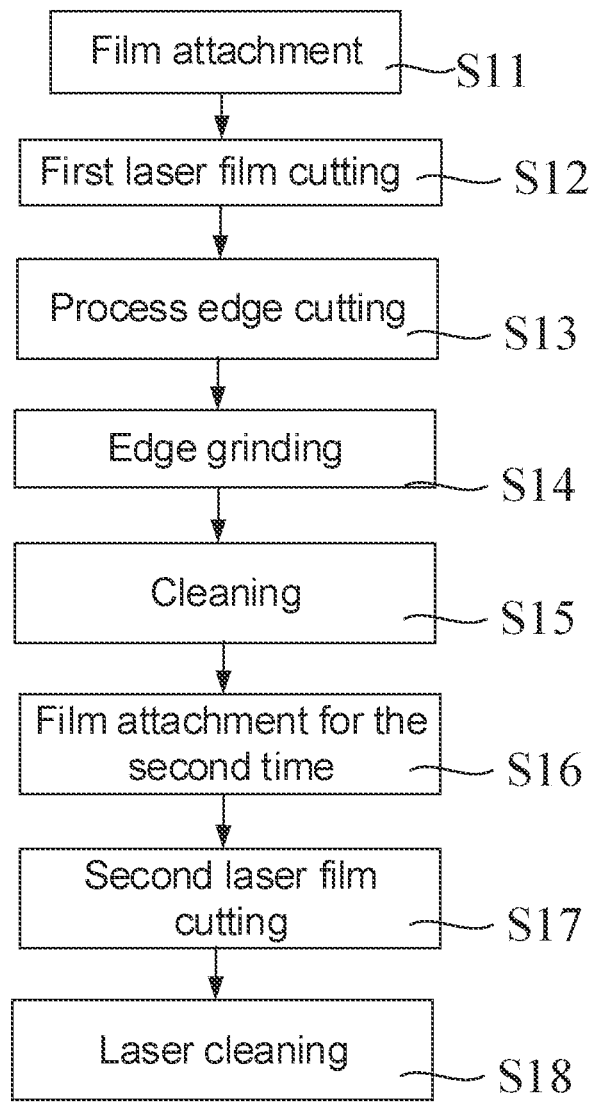
FIG. 29 is a process diagram of a method for manufacturing a display module, in accordance with some embodiments of the present disclosure.
Figure 30A:
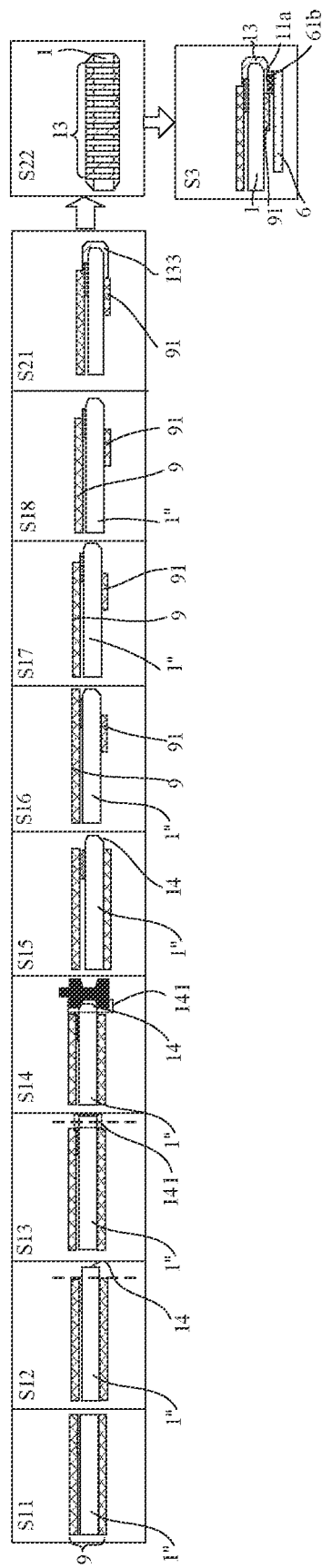
FIG. 30A is a process diagram of another method for manufacturing a display module, in accordance with some embodiments of the present disclosure.
Figure 30B:
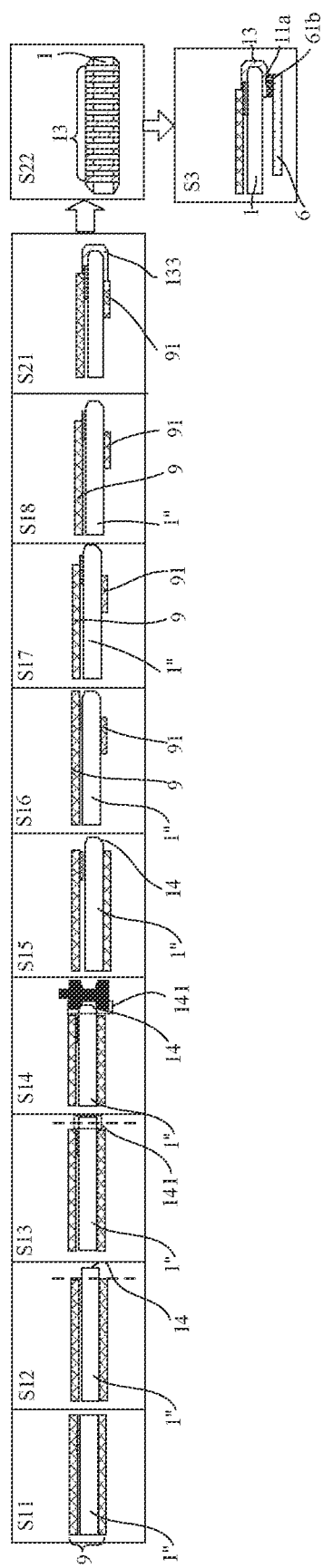
FIG. 30B is a process diagram of yet another method for manufacturing a display module, in accordance with some embodiments of the present disclosure.

After the plurality of bonding electrodes 11a are formed, the initial display panel 1" with the plurality of bonding electrodes 11a serves as the display panel 1 in the embodiments of the present disclosure. As shown in FIGS. 29, 30A and 30B, a process of forming the initial display panel 1" includes the following steps.

In a step S11, film attachment is performed. Films 9 are attached to the display surface 12 and the non-display surface 11 of the initial display panel 1". For example, a material of the films 9 may be polymethyl methacrylate.

In a step S12, a first laser film cutting is performed. The laser is used to cut the films, so that the films 9 attached to the display surface 12 and the non-display surface 11 of the initial display panel 1" are cut to expose edges of the display surface 12 and the non-display surface 11 that are connected to a single side surface 14 of the initial display panel 1".

In a step S13, process edge cutting is performed. A process edge 141 of the side surface 14 of the initial display panel 1" is cut.

In a step S14, edge grinding is performed. The process edge 141 is ground to form chamfers.

In a step S15, cleaning is performed. The initial display panel 1" with the ground process edge 141 is cleaned.

In a step S16, the film attachment is performed again. The display surface 12 of the initial display panel 1" is attached with another film 9, and the non-display surface 11 of the initial display panel 1" is attached with a protective film 91 with a certain design shape. For example, a material of the protective film 91 may be polymethyl methacrylate.

In a step S17, a second laser film cutting is performed. The film 9 that is attached to the display surface 12 of the initial display panel 1" for the second time is cut to expose pads on the display surface 12 for being connected to a driving circuit.

In a step S18, laser cleaning is performed. Laser cleaning is performed on the initial display panel 1" to clean submicron-level contamination particles on surfaces of the initial display panel 1".

Figure 31:
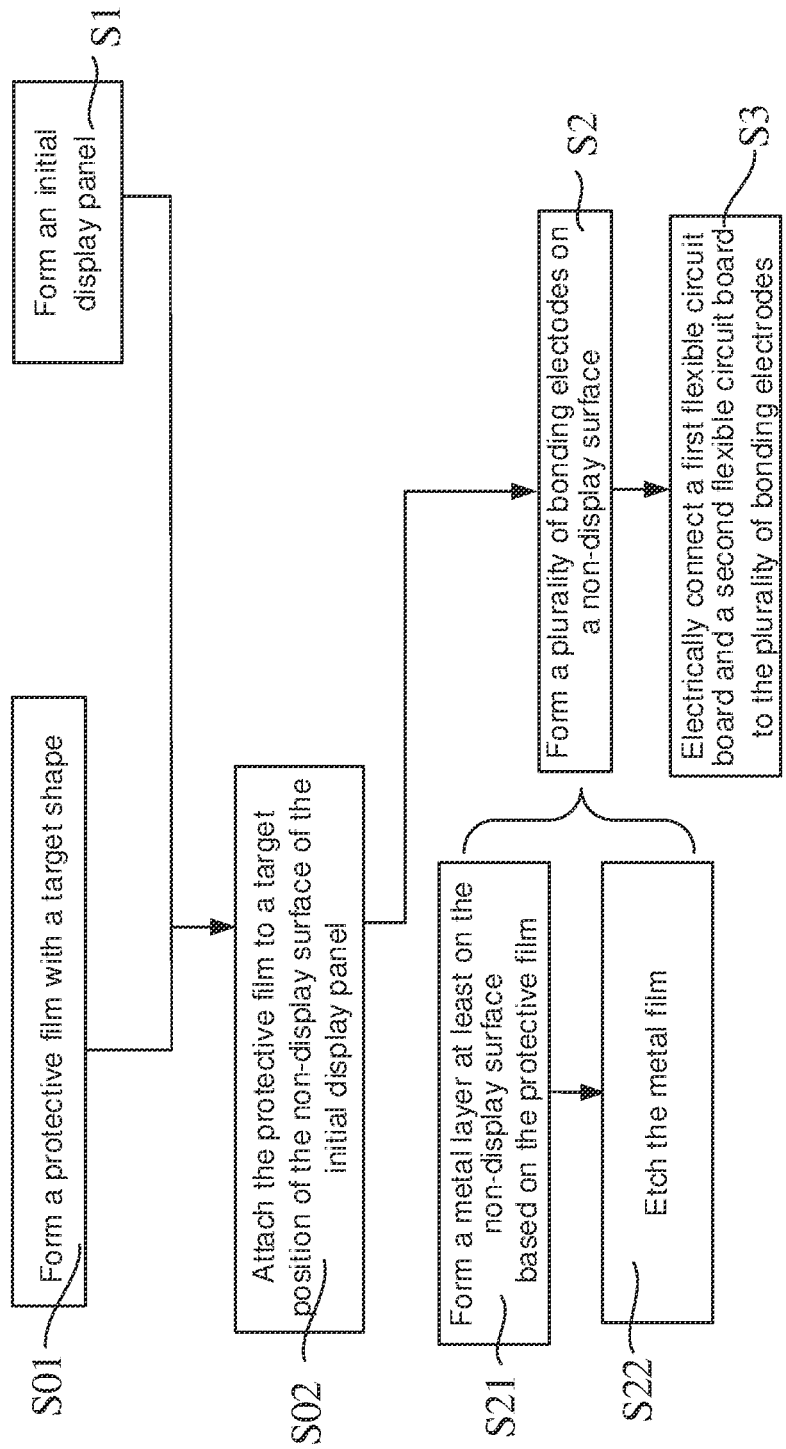
FIG. 31 is a flowchart of another method for manufacturing a display module, in accordance with some embodiments of the present disclosure.

In some embodiments, before the plurality of bonding electrodes 11a are formed on the non-display surface 11, as shown in FIG. 31, the method further includes the following steps.

Figure 32:
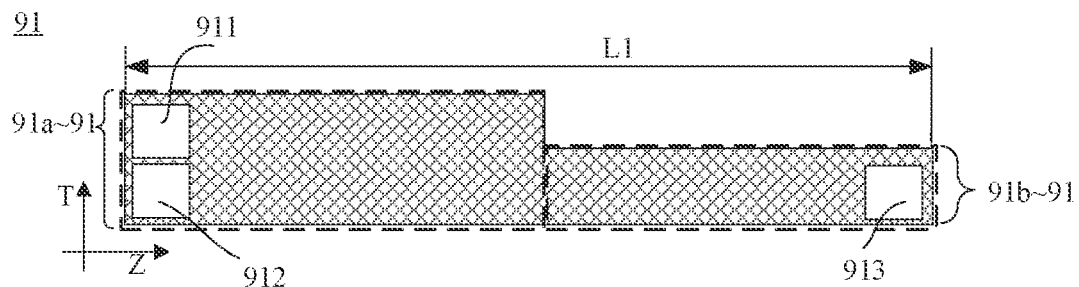
FIG. 32 is a structural diagram of a protective film, in accordance with some embodiments of the present disclosure.
Figure 33:
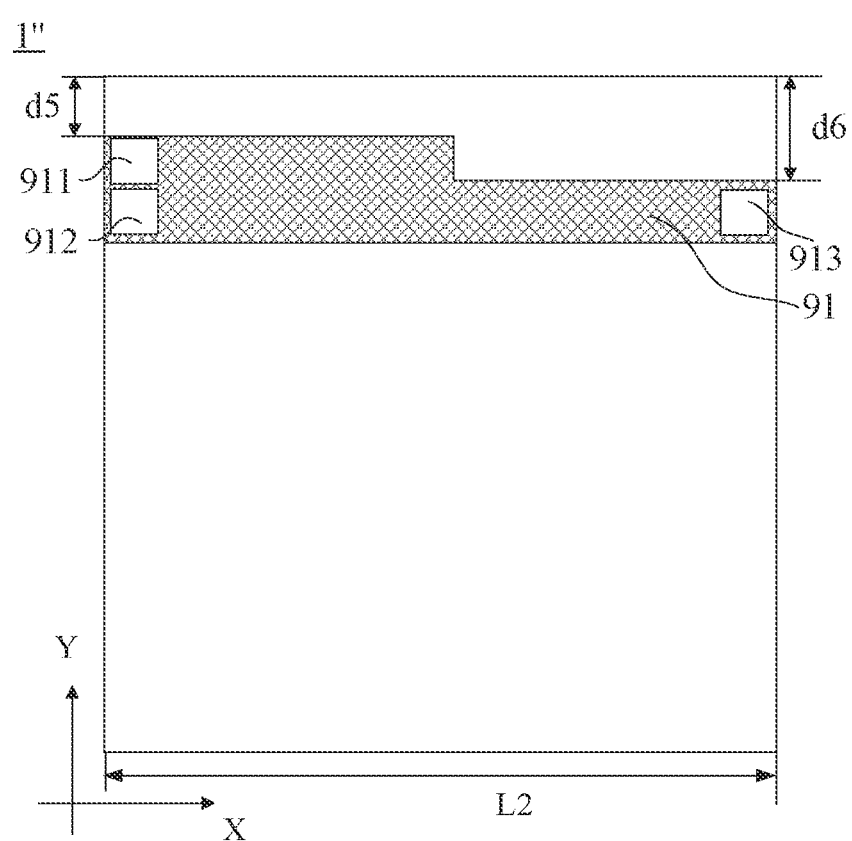
FIG. 33 is a structural diagram of another initial display panel, in accordance with some embodiments of the present disclosure.

In a step S01, the protective film 91 with a target shape is formed. As shown in FIG. 32, the protective film 91 includes a first portion 91a and a second portion 91b that are arranged in a third direction Z. A dimension of the first portion 91a in a fourth direction T is greater than a dimension of the second portion 91b in the fourth direction T. In the fourth direction T, an end of the first portion 91a and an end of the second portion 91b that are located on a same side are flushed with each other. For example, with reference to FIG. 32 again, lower ends of the first portion 91a and the second portion 91b are flush with each other in an exemplary front view of the protective film 91. As shown in FIGS. 32 and 33, a maximum dimension L1 of the protective film 91 in the third direction Z is greater than or equal to a dimension L2 of the non-display surface 11 in the second direction X. It will be noted that, the second direction X is the extension direction of the selected side edge 11cc, the direction perpendicular to the second direction X is the first direction Y, the third direction Z is parallel to the second direction X, the fourth direction T is parallel to the first direction Y, that is, the third direction Z is perpendicular to the fourth direction T.

In a step S02, the protective film 91 is attached to a target position of the non-display surface 11 of the initial display panel 1". With continued reference to FIG. 33 again, a direction in which the first portion 91a and the second portion 91*b* are arranged is parallel to the extension direction of the selected side edge 11*cc*; the flush ends of the first portion 91*a* and the second portion 91*b* are away from the selected side edge 11*cc*; each of the first portion 91*a* and the second portion 91*b* is at a designated distance from the selected side edge 11*cc*. The first portion 91*a* and the selected side edge 11*cc* have a designated distance d5 therebetween, and the second portion 91*b* and the selected side edge 11*cc* have a designated distance d6 therebetween.

In some examples, with continued reference to FIG. 33 again, the designated distance d5 between the first portion 91*a* and the selected side edge 11*cc* is 3 mm, and the designated distance d6 between the second portion 91*b* and the selected side edge 11*cc* is 8 mm.

Figure 34:
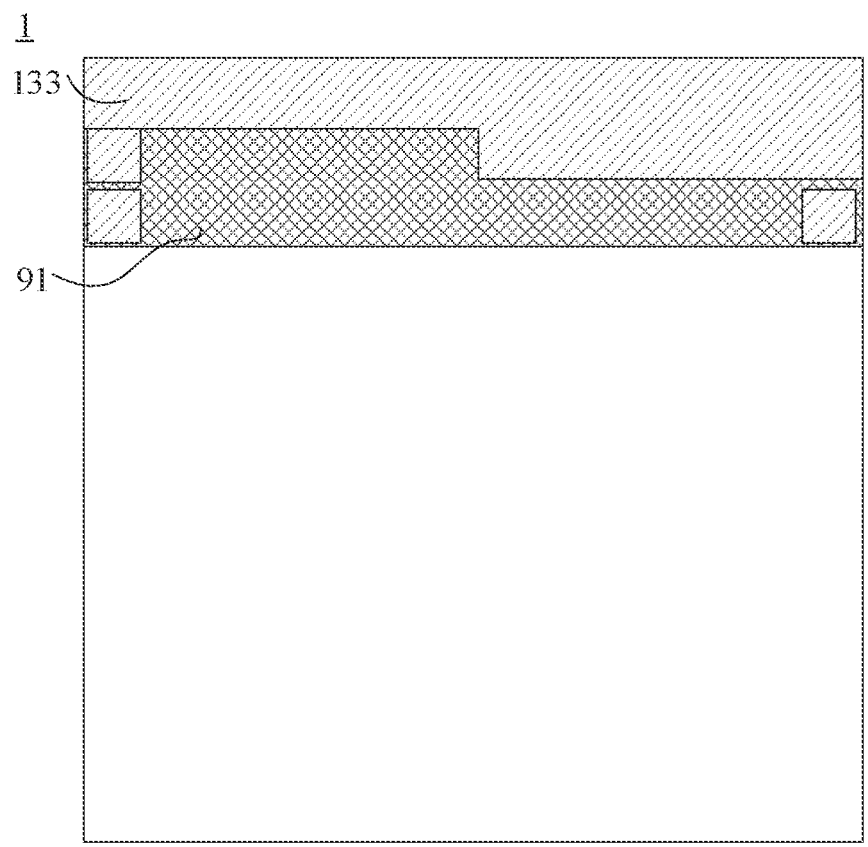
FIG. 34 is a structural diagram of yet another display panel, in accordance with some embodiments of the present disclosure.

In some embodiments, as shown in FIG. 34, based on the protective film 91, a metal layer 133 is formed at least on the non-display surface 11. With reference to FIGS. 30A, 30B and 31 again, a process of forming the metal layer 133 include the following steps.

In a step S21, the side surface 14 of the initial display panel 1″ and edges of the display surface 12 and the non-display surface 11 that are connected to the side surface 14 are sputtered with metal to form the metal layer 133.

The metal layer 133 covers the side surface 14, a region of the display surface proximate to the side surface 14, and a region of the non-display surface 11 proximate to the side surface 14 and exposed by the protective film 91. For example, the metal may be sputtered and deposited by an electroplating process, an evaporation process, pad printing silver paste, or a sputtering process (e.g., a multi-arc magnetron sputtering process).

In some embodiments, with continued reference to FIGS. 30A, 30B and 31 again, a process of forming the plurality of bonding electrodes 11*a* on the non-display surface 11 includes the following step in addition to the step S21.

Figure 35:
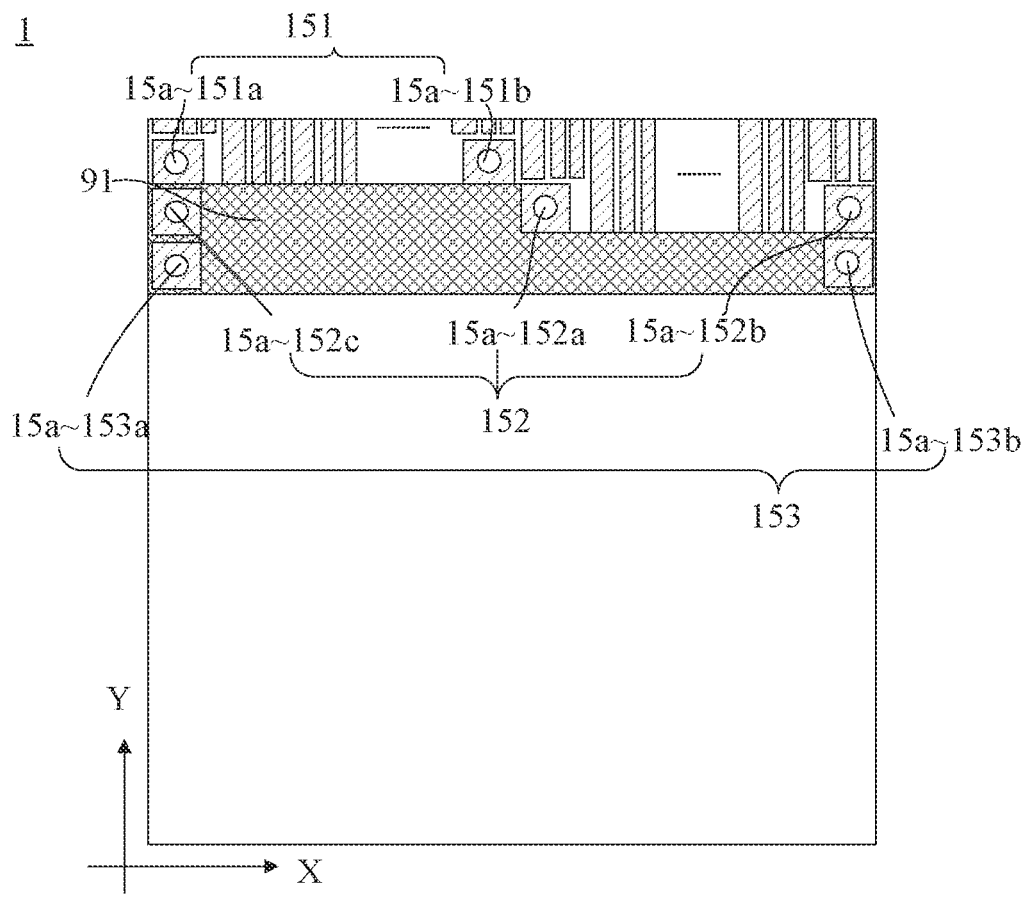
FIG. 35 is a structural diagram of yet another display panel, in accordance with some embodiments of the present disclosure.

In a step S22, the metal layer 133 is etched to form the plurality of bonding electrodes 11*a* on the non-display surface 11, as shown in FIG. 35. For example, with reference to FIG. 7 again, the plurality of bonding electrodes 11*a* are divided into the first bonding electrode group 11*aa* and the second bonding electrode group 11*ab* with the boundary between the first portion 91*a* and the second portion 91*b* of the protective film 91 as the dividing line.

Figure 36:
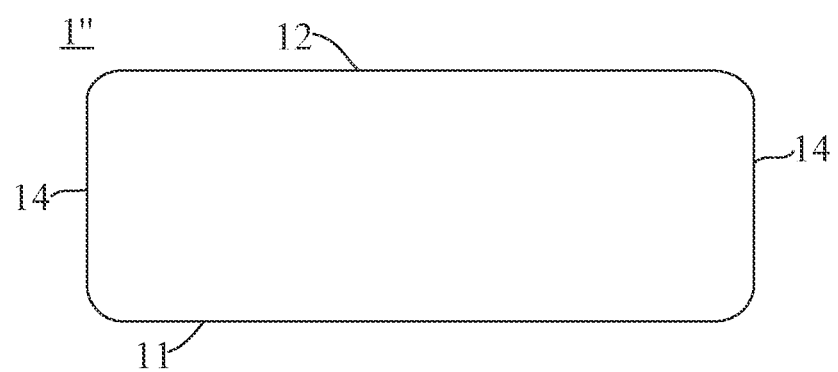
FIG. 36 is a side view of an initial display panel, in accordance with some embodiments of the present disclosure.

In some embodiments, as shown in FIG. 36, the initial display panel 1″ further includes the display surface 12 and the plurality of side surfaces 14 connecting the display surface 12 to the non-display surface 11. Etching the metal layer 133 includes etching the metal layer located on the side surface 14, in the region of the display surface proximate to the side surface 14 and the region of the non-display surface 11 proximate to the side surface 14 and exposed by the protective film 91, so that the plurality of side lines arranged at intervals are formed. An end of each side line extends to the display surface, and the other end of the side line extends to the non-display surface. The end of each side line extending to the non-display surface serves as one of the plurality of bonding electrodes. It will be understood that, after the metal layer 133 is etched, an organic resin layer may be used to protect a portion of the side lines other than portions to be bonded to the flexible circuit boards. The organic resin may be in a dark color such as black, green, brown, etc., or may be transparent or white.

For portions of the metal layer 133 located on the non-display surface, based on the target shape of the protective film 91, with the boundary between the first portion 91*a* and the second portion 91*b* of the protective film 91 as the dividing line, and in the first direction Y, a dimension of a portion of the metal layer located on a side of the dividing line is less than a dimension of a portion of the metal layer on the other side of the dividing line. Therefore, the bonding electrodes formed by etching the metal layer 133 are different in dimension in the first direction Y. That is to say, lengths of the ends, extending on the non-display surface, of the side lines are different. For example, a length of a bonding electrode in the first bonding electrode group 11*aa* is less than a length of a bonding electrode in the second bonding electrode group 11*ab*.

In some embodiments, the non-display surface 11 is further provided thereon with the at least one alignment mark 15. With reference to FIG. 35 again, the at least one alignment mark 15 includes the plurality of alignment marks 15, and the plurality of alignment marks 15 include the first alignment mark group 151, the second alignment mark group 152 and the third alignment mark group 153 that are arranged at intervals in the first direction Y. The first alignment mark group 151 includes the first alignment sub-mark 151*a* and the second alignment sub-mark 151*b*. The second alignment mark group 152 includes the third alignment sub-mark 152*a*, the fourth alignment sub-mark 152*b* and the fifth alignment sub-mark 152*c*. The third alignment mark group 153 includes the sixth alignment sub-mark 153*a* and the seventh alignment sub-mark 153*b*.

In some embodiments, with reference to FIG. 21 again, the alignment mark 15 includes the mark pattern 15*a* and the clearance region 15*b* that is disposed around the mark pattern 15*a*. The clearance region 15*b* is insulated from the region surrounding the clearance region 15*b*. The mark pattern 15*a* may be in the shape of a circle or a cross. The clearance region 15*b* may be in the shape of a circle or a square. In some examples, as shown in FIG. 21, the mark pattern 15*a* is circular, the clearance region 15*b* surrounding the mark pattern 15*a* is square, and the clearance region 15*b* and a bonding electrode 11*a* adjacent thereto have the distance d4 therebetween, so that the clearance region 15*b* is kept insulated from the region around the clearance region 15*b*, which avoids the influence of the lines around on identification and alignment, and then improves the accuracy of alignment.

In some examples, with reference to FIG. 22 again, the mark pattern 15*a* is cross-shaped, and the clearance region 15*b* surrounding the mark pattern 15*a* is circular.

In some embodiments, with reference to FIG. 24 again, the first wiring region 6*m* of the first flexible circuit board 6 includes the first bonding region 6*m*1 and the first alignment mark region 6*m*2 that are arranged in the first direction Y. The first alignment mark region 6*m*2 is connected to the first fan-out region 6*n*. The plurality of first conductive contact pieces 61*b* are disposed in the first bonding region 6*m*1. The second wiring region 7*m* of the second flexible circuit board 7 includes the second bonding region 7*m*1 and the second alignment mark region 7*m*2 that are arranged in the first direction Y. The second alignment mark region 7*m*2 is connected to the second fan-out region 7*n*. The plurality of second conductive contact pieces 71*b* are disposed in the second bonding region 7*m*1.

For positions of the first alignment sub-mark 151*a*, the second alignment sub-mark 151*b*, the third alignment sub-mark 152*a*, the fourth alignment sub-mark 152*b*, the fifth alignment sub-mark 152*c*, the sixth alignment sub-mark 153*a* and the seventh alignment sub-mark 152*b* relative to the first flexible circuit board 6 and the second flexible circuit board 7, references may be made to the above description, which will not be repeated here.

The method for manufacturing the display module further includes a step of forming the plurality of alignment marks 15. Target positions of the plurality of alignment marks 15 are determined according to positional relationship between the plurality of alignment marks 15 and each of the first flexible circuit board 6 and the second flexible circuit board 7 that are subsequently bonded.

In some embodiments, in the step of forming the protective film 91 having the target shape, with reference to FIG. 32 again, the protective film 91 includes a first hollowed-out region 911, a second hollowed-out region 912 and a third hollowed-out region 913. The first hollowed-out region 911, the second hollowed-out region 912 and the third hollowed-out region 913 correspond to a position of the fifth alignment sub-mark 152c, a position of the sixth alignment sub-mark 153a and a position of the seventh alignment sub-mark 153b, respectively.

In the step S02 of attaching the protective film 91 to the target position of the non-display surface 11 of the initial display panel 1", with reference to FIG. 33 again, portions of non-display surface 11 corresponding to the first hollowed-out region 911, the first hollowed-out region 911, the second hollowed-out region 912 and the third hollowed-out region 913 of the protective film 91 are exposed.

In the step S21 of forming the metal layer 133 on the non-display surface 11 based on the protective film 91, with reference to FIG. 34 again, the metal layer 133 further covers the exposed portions of the non-display surface 11 corresponding the first hollowed-out region 911, the hollowed-out region 912 and the third hollowed-out region 913 of the protective film 91. It will be noted that, in a process of sputtering the metal, there will also be a small amount of metal on a surface of the protective film 91. For convenience of illustrating the metal layer, the metal on the surface of the protective film 91 is not shown in FIG. 34. The metal layer 133 in embodiments of the present disclosure only refers to a metal layer on the non-display surface. The protective film will be peeled off in a subsequent process, so a pattern of the metal layer 133 is consistent with a pattern shown in FIG. 34.

In some embodiments, in the step S22 of etching the metal layer 133 to form the plurality of bonding electrodes 11a on the non-display surface 11, with reference to FIG. again, the first alignment sub-mark 151a and the second alignment sub-mark 151b, the third alignment sub-mark 152a, the fourth alignment sub-mark 152b, the fifth alignment sub-mark 152c, the sixth alignment sub-mark 153a and seventh alignment sub-mark 153b are formed simultaneously as the plurality of bonding electrodes 11a. For example, when required etching patterns are set in a laser etching equipment to form the plurality of bonding electrodes 11a, the first alignment sub-mark 151a and the second alignment sub-mark 151b, the third alignment sub-mark 152a, the fourth alignment sub-mark 152b, the fifth alignment sub-mark 152c, the sixth alignment sub-mark 153a and seventh alignment sub-mark 153b are formed simultaneously as the plurality of bonding electrodes 11a.

In some embodiments, with reference to FIG. 23 again, in the step S3 of electrically connecting the first flexible circuit board 6 and the second flexible circuit board 7 to the plurality of bonding electrodes 11a, the first flexible circuit board 6 and the second flexible circuit board 7 are aligned with the plurality of bonding electrodes 11a, and the first flexible circuit board 6 and the second flexible circuit board 7 are electrically connected to the plurality of bonding electrodes 11a according to the first alignment mark group 151, the second alignment mark group 152 and the third alignment mark group 153. For example, according to the fourth alignment sub-mark 152b and the fifth alignment sub-mark 152c, the first adhesive film 81 is formed at target positions of the first bonding electrode group 11aa, and the second adhesive film 82 is formed at target positions of the second bonding electrode group 11ab. The first flexible circuit board 6 is connected to the first bonding electrode group 11aa through the first adhesive film 81. The second flexible circuit board 7 is connected to the second bonding electrode group 11ab through the second adhesive film 82. The first adhesive film 81 and the second adhesive film 82 each extend in the second direction X, and the first adhesive film 81 is closer to the selected side edge 11cc than the second adhesive film 82.

Figure 37:
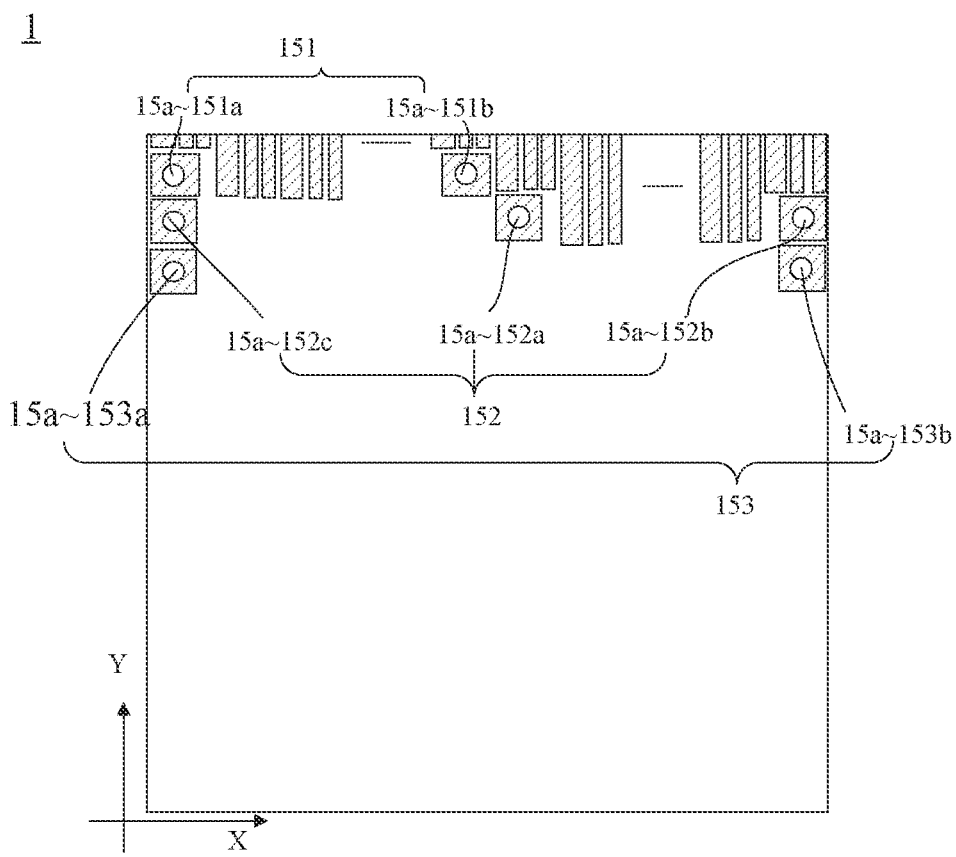
FIG. 37 is a structural diagram of yet another display panel, in accordance with some embodiments of the present disclosure.

In some embodiments, with reference to FIG. 30B, after the metal layer 133 is etched and before the step of electrically connecting the first flexible circuit board 6 and the second flexible circuit board 7 to the plurality of bonding electrodes 11a, the protective film 91 is peeled off from the non-display surface 11 to obtain the display panel 1 with a structure shown in FIG. 37. Structures of the bonding electrodes 11a and the alignment marks 15 in the display panel 1 are as described above, which will not be repeated here.

In some embodiments, with reference to FIG. 25 again, the two side edges 11c of the non-display surface 11 are the selected side edges 11cc, one of the selected side edges 11cc of the non-display surface 11 has the high requirements on tolerance specification of the flexible circuit board, and the other of the selected side edges 11cc of the non-display surface 11 has the low requirements on tolerance specification of the flexible circuit board. In this case, the selected side edge 11cc that has the high requirements on tolerance specification of the flexible circuit board may be provided with the first alignment mark group 151, the second alignment mark group 152 and the third alignment mark group 153 depend on the above content, so that the first flexible circuit board 6 and the second flexible circuit board 7 are bonded to the display panel 1. For the manufacturing method, references may be made to the content above, which will not be repeated here. The selected side edge 11cc has the low requirements on the tolerance specification of the flexible circuit board may be provided with the corresponding alignment marks 15 for identification and alignment, so that another flexible circuit board is accurately aligned with and bonded to the display panel. For example, with continued reference to FIG. 25 again, the tolerance of the third flexible circuit board 8 with the large length meets the bonding requirements of one of the selected side edges 11cc, and the fourth alignment mark group 154 (the eighth alignment sub-mark 154a and the ninth alignment sub-mark 154b) and the fifth alignment mark group 155 (the tenth alignment sub-mark 155a and the eleventh alignment sub-mark 155b) may be used for alignment during bonding of the third flexible circuit board 8. References may be made to the description above, which will not be repeated here.

Figure 38:
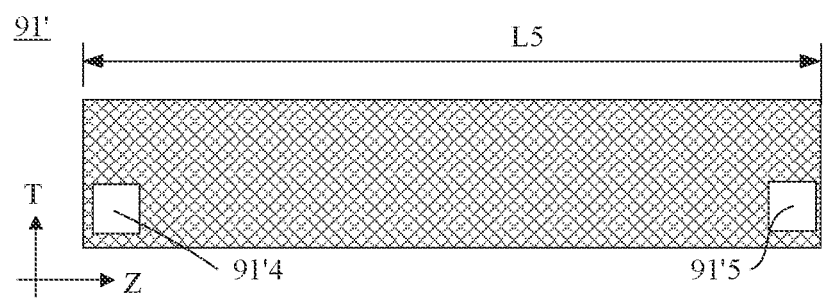
FIG. 38 is a structural diagram of another protective film, in accordance with some embodiments of the present disclosure.

In some embodiments, as shown in FIG. 25, in a case where the two side edges 11c of the non-display surface 11 are the selected side edges 11cc, one of the selected side edges 11cc of the non-display surface 11 has the high requirements on tolerance specification of the flexible circuit board, and the other selected side edge 11cc has the low requirements on tolerance specification of the flexible circuit board, the method for manufacturing the display panel 1 is as shown in FIG. 31, which will not be detailed here. A difference is that, for the selected side edge 11cc which has the low requirements on tolerance specification of the flexible circuit board, a protective film 91' with a target shape is formed in the step S01. As shown in FIG. 38, the protective film 91' includes the fourth hollowed-out region 91'4 and the fifth hollowed-out region 91'5, and a fourth hollowed-out region 91'4 and a fifth hollowed-out region 91'5 respectively correspond to positions where the tenth alignment sub-mark 155*a* and the eleventh alignment sub-mark 155*b* are located. A maximum dimension L5 of the protective film 91' in the third direction Z is greater than or equal to the dimension L2 of the non-display surface 11 in the second direction X.

Figure 39:
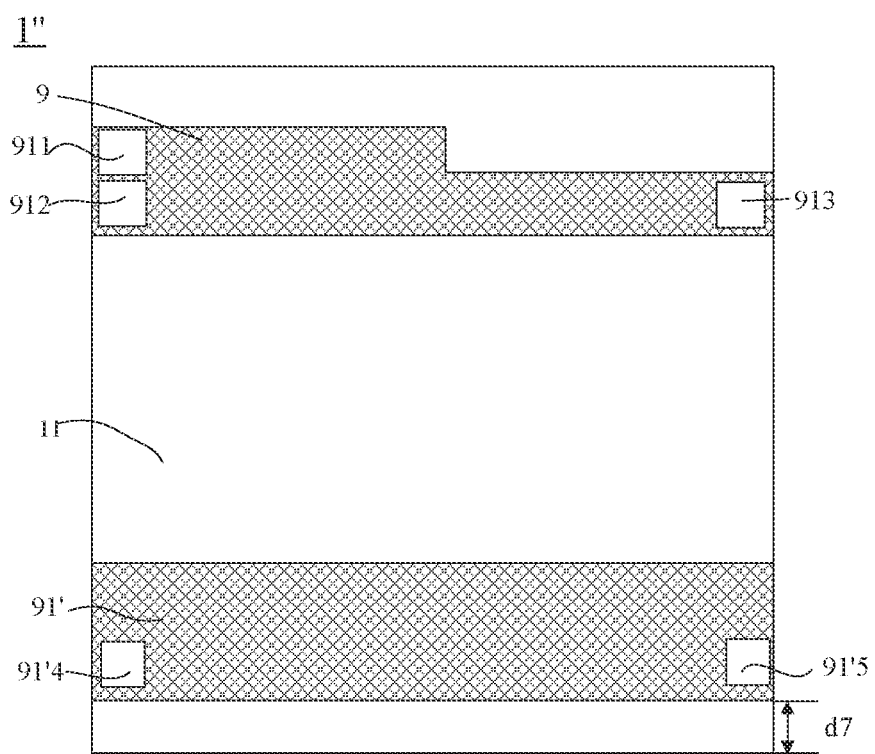
FIG. 39 is a structural diagram of yet another initial display panel, in accordance with some embodiments of the present disclosure.

In the step S02 of attaching the protective film 91' to the target position of the non-display surface 11 of the initial display panel 1", as shown in FIG. 39, the portions of the non-display surface 11 corresponding to the first hollowed-out region 911, the second hollowed-out region 912 and the third hollowed-out region 913 of the protective film 91 and portions of the non-display surface 11 corresponding to the fourth hollowed-out region 91'4 and the fifth hollowed-out region 91'5 of the protective film 91' are exposed.

In some examples, with continued reference to FIG. 39, the protective film 91' and a corresponding selected side edge 11*cc* have a designated distance d7 therebetween. For example, the distance d7 between the protective film 91' and the corresponding selected side edge 11*cc* is 2 mm.

Figure 40:
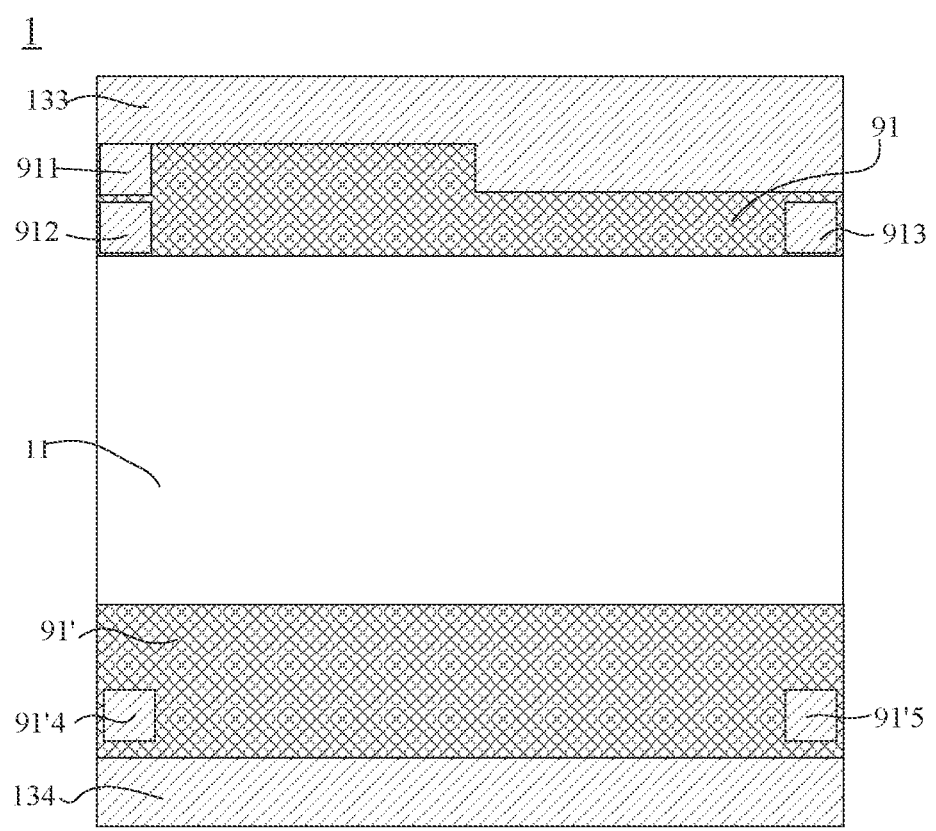
FIG. 40 is a structural diagram of yet another display panel, in accordance with some embodiments of the present disclosure.

Based on the protective film 91 and the protective film 91', in the step S21 of forming the metal layer 133 on one selected side edge 11*cc* of the non-display surface 11 and forming a metal layer 134 on the other selected side edge 11*cc*, as shown in FIG. 40, the metal layer 133 further covers the portions of the non-display surface 11 exposed by the first hollowed-out region 911, the second hollowed-out region 912 and the third hollowed-out region 913 of the protective film 91; and the metal layer 134 further covers the portions of the non-display surface 11 exposed by the fourth hollowed-out region 91'4 and the fifth hollowed-out region 91'5 of the protective film 91'.

Figure 41:
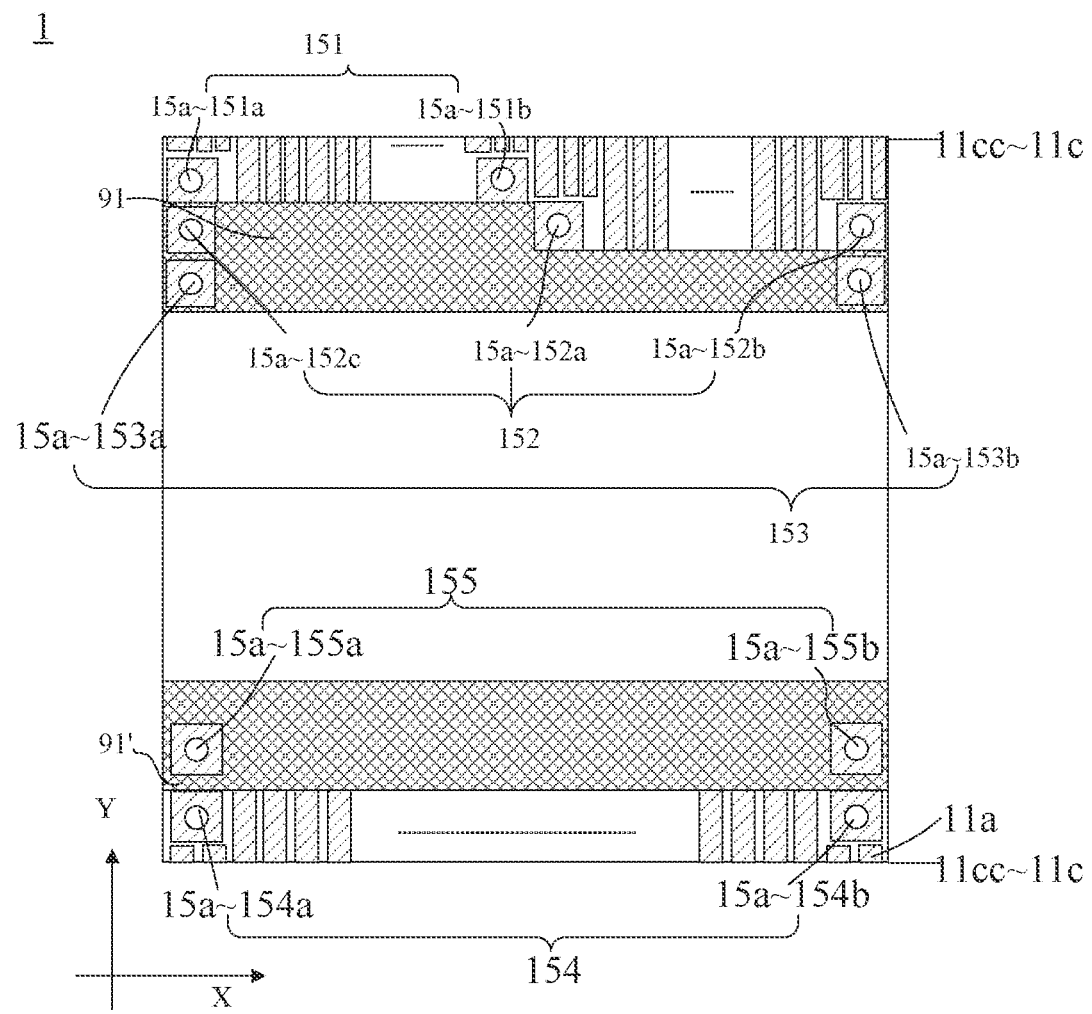
FIG. 41 is a structural diagram of yet another display panel, in accordance with some embodiments of the present disclosure.

In some embodiments, in the step S22 of etching the metal layer 134 to form another plurality of bonding electrodes 11*a* in a region of the non-display surface 11 corresponding to the metal layer 134, as shown in FIG. 41, the tenth sub-alignment mark 155*a* and the eleventh alignment sub-mark 155*b* are formed simultaneously as the plurality of bonding electrodes 11*a*. The step of etching the metal layer 133 will not be repeated here.

In some embodiments, with reference to FIG. 25 again, in the step S3 of electrically connecting the third flexible circuit board 8 to the plurality of bonding electrodes 11*a*, the tenth alignment sub-mark 155*a* and the eleventh alignment sub-mark 155*b* are used as described above, which will not be repeated here.

It will be noted that, the metal layer 134 and the metal layer 133 are metal layers sprayed at different selected side edges 11*cc* of the display panel 1.

In some other embodiments, with reference to FIG. 14 again, the two side edges 11*c* of the non-display surface 11 are the selected side edges 11*cc*, the two selected side edges 11*cc* are arranged oppositely on the non-display surface 11 of the display panel 1, and the two selected side edges 11*cc* of the surface 11 both have the high requirements on tolerance specification of the flexible circuit board. In this case, the bonding electrodes 11*a* along each selected side edge 11*cc* are divided into the first bonding electrode group 11*aa* and the second bonding electrode group 11*ab*. As shown in FIG. 15, the bonding electrodes 11*a* in the first bonding electrode group 11*aa* along each selected side edge 11*cc* are connected to corresponding first conductive contact pieces 61*b* of a respective first flexible circuit board 6, and bonding electrodes 11*a* in the second bonding electrode group 11*ab* are electrically connected to corresponding second conductive contact pieces 71*b*. The left-right arrangement positions of the first flexible circuit board 6 and the second flexible circuit board 7 along each selected side edge 11*cc* are determined depend on design requirements, which will not be detailed here. For the method for manufacturing the display module 10 in these embodiments, the two selected side edges 11*cc* of the non-display surface 11 may be formed according to the above steps of manufacturing the display module as shown in FIG. 6, which will not be repeated here.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:
   a display panel, wherein a non-display surface of the display panel includes a plurality of side edges, and the plurality of side edges include at least one selected side edge; the display panel includes a plurality of bonding electrodes disposed on the non-display surface, and the plurality of bonding electrodes are sequentially arranged at intervals along a selected side edge; the plurality of bonding electrodes are divided into a first bonding electrode group and a second bonding electrode group; the first bonding electrode group includes a portion of the plurality of bonding electrodes, and the second bonding electrode group includes another portion of the plurality of bonding electrodes;
   a first flexible circuit board having a first wiring region and a first fan-out region that are connected to each other, wherein the first wiring region is closer to the selected side edge than the first fan-out region; the first flexible circuit board includes a plurality of first conductive contact pieces that are arranged at intervals in the first wiring region; and each first conductive contact piece is electrically connected to a bonding electrode in the first bonding electrode group; and
   a second flexible circuit board having a second wiring region and a second fan-out region that are connected to each other, wherein the second wiring region is closer to the selected side edge than the second fan-out region; the second flexible circuit board includes a plurality of second conductive contact pieces that are arranged at intervals in the second wiring region; and each second conductive contact piece is electrically connected to a bonding electrode in the second bonding electrode group,
   wherein the first wiring region is closer to the selected side edge than the second wiring region in a first direction; the first fan-out region and the second wiring region have a distance therebetween in a second direction; the first direction is perpendicular to the second direction; and the second direction is an extension direction of the selected side edge; and
   in the second direction, a minimum distance between the first fan-out region and the second wiring region is greater than 1 mm.

2. The display module according to claim 1, wherein in the first direction, an edge of the first wiring region away from the selected side edge is closer to the selected side edge than an edge of the second wiring region proximate to the selected side edge.

3. The display module according to claim 2, wherein in the first direction, a distance between the second wiring region and the first wiring region is greater than 1 mm.

4. The display module according to claim 1, wherein the display panel further includes: a display surface, a plurality of side surfaces connecting the display surface to the non-display surface, and a plurality of side lines arranged at intervals on a side surface in the plurality of side surfaces proximate to the selected side edge; an end of each side line extends to the display surface, and another end of the side line extends to the non-display surface; and the end of the side line extending to the non-display surface serves as one of the plurality of the bonding electrodes.

5. The display module according to claim 1, wherein the plurality of bonding electrodes each extend in the first direction; a minimum of lengths of bonding electrodes in the first bonding electrode group in an extension direction thereof is less than a minimum of lengths of bonding electrodes in the second bonding electrode group in an extension direction thereof.

6. The display module according to claim 1, wherein the plurality of first conductive contact pieces are in one-to-one correspondence with a plurality of bonding electrodes in the first bonding electrode group; the plurality of second conductive contact pieces are in one-to-one correspondence with a plurality of bonding electrodes in the second bonding electrode group; the display module further comprises:
a first adhesive film located between the plurality of first conductive contact pieces and the first bonding electrode group, the first adhesive film being in direct contact with the plurality of first conductive contact pieces and the first bonding electrode group; and
a second adhesive film located between the plurality of second conductive contact pieces and the second bonding electrode group, the second adhesive film being in direct contact with the plurality of second conductive contact pieces and the second bonding electrode group, wherein
the first adhesive film and the second adhesive film each extend in the second direction; and the first adhesive film is closer to the selected side edge than the second adhesive film.

7. The display module according to claim 1, wherein the display panel further includes at least one alignment mark disposed on the non-display surface; and the at least one alignment mark is used for an alignment between the plurality of the first conductive contact pieces and bonding electrodes in the first bonding electrode group and an alignment between the plurality of second conductive contact pieces and bonding electrodes in the second bonding electrode group during connection.

8. The display module according to claim 7, wherein the alignment mark includes a mark pattern and a clearance region disposed around the mark pattern, and the clearance region is insulated from a region around the clearance region.

9. The display module according to claim 8, wherein the at least one alignment mark includes a plurality of alignment marks; the plurality of alignment marks includes a first alignment mark group, a second alignment mark group and a third alignment mark group that are arranged at intervals in the first direction;
the first wiring region of the first flexible circuit board includes a first bonding region and a first alignment mark region that are arranged in the first direction; the first alignment mark region is connected to the first fan-out region; and the plurality of first conductive contact pieces are disposed in the first bonding region; and the second wiring region of the second flexible circuit board includes a second bonding region and a second alignment mark region that are arranged in the first direction; the second alignment mark region is connected to the second fan-out region; and the plurality of second conductive contact pieces are disposed in the second bonding region, wherein the first alignment mark group includes a first alignment sub-mark and a second alignment sub-mark; a mark pattern of the first alignment sub-mark and a mark pattern of the second alignment sub-mark are located within an orthographic projection of the first alignment mark region on the non-display surface, and the mark pattern of the first alignment sub-mark is symmetrical with the mark pattern of the second alignment sub-mark with respective to an center line, in the first direction, of the orthographic projection of the first alignment mark region on the non-display surface; the first alignment sub-mark is closer to a side edge, which is connected to the selected side edge and proximate to the first alignment mark group, of the non-display surface than the second alignment sub-mark;

the second alignment mark group includes a third alignment sub-mark, a fourth alignment sub-mark and a fifth alignment sub-mark; a mark pattern of the third alignment sub-mark and a mark pattern of the fourth alignment sub-mark are located within an orthographic projection of the second alignment mark region on the non-display surface; the mark pattern of the third alignment sub-mark is symmetrical with the mark pattern of the fourth alignment sub-mark with respective to a center line, in the first direction, of the orthographic projection of the second alignment mark region on the non-display surface; the fourth alignment sub-mark is closer to another side edge, which is connected to the selected side edge, of the non-display surface than the third alignment sub-mark; a center of the five alignment sub-marks, a center of the third alignment sub-mark and a center of the fourth alignment sub-mark are located on a same line in the second direction; and a mark pattern of the fifth alignment sub-mark is located on a side of an orthographic projection of the first fan-out region on the non-display surface in the second direction; and the third alignment mark group includes a sixth alignment sub-mark and a seventh alignment sub-mark; a mark pattern of the sixth alignment sub-mark is symmetrical with a mark pattern of the seventh alignment sub-mark with respective to a center line of the non-display surface in the first direction; the mark pattern of the seventh alignment sub-mark is located on a side of an orthographic projection of the second fan-out region on the non-display surface in the second direction.

10. A display device, comprising the display module according to claim 1.

11. The display module according to claim 1, wherein the at least one selected side edge includes two selected side edges disposed opposite to each other; the selected side edge corresponding to the plurality of bonding electrodes, the first flexible circuit board and the second flexible circuit board is a selected side edge of the two selected side edges;

the display panel further includes another plurality of bonding electrodes disposed on the non-display surface;

the display module further includes another first flexible circuit board and another second flexible circuit board; the another first flexible circuit board are bonded to a first bonding electrode group included in the another plurality of bonding electrodes at another selected side edge of the two selected side edges; the another second flexible circuit board are bonded to a second bonding electrode group included in the another plurality of bonding electrodes at the another selected side edge of the two selected side edges, wherein the first flexible circuit board corresponding to the selected side edge is disposed opposite to the another second flexible circuit board corresponding to the another selected side edge; and the second flexible circuit board corresponding to the selected side edge is disposed opposite to the another first flexible circuit board corresponding to the another selected side edge.

12. The display module according to claim 1, wherein the at least one selected side includes two selected side edges disposed opposite to each other; the selected side edge corresponding to the plurality of bonding electrodes, the first flexible circuit board and the second flexible circuit board is a selected side edge of the two selected side edges;

the display panel further includes another plurality of bonding electrodes disposed on the non-display surface;

the display module further includes a third flexible circuit board; and the third flexible circuit board are bonded to the another plurality of bonding electrodes at another selected side edge of the two selected side edges, wherein in the second direction, a maximum dimension of the third flexible circuit board is greater than a maximum dimension of each of the first flexible circuit board and the second flexible circuit board.

13. A method for manufacturing a display module, the method comprising:

forming an initial display panel, wherein a non-display surface of the initial display panel includes a plurality of side edges, and the plurality of side edges include at least one selected side edge;

forming a plurality of bonding electrodes on the non-display surface to provide a display panel including the initial display panel and the plurality of bonding electrodes, wherein the plurality of bonding electrodes are sequentially arranged at intervals along a selected side edge; the plurality of bonding electrodes are divided into a first bonding electrode group and a second bonding electrode group; and the first bonding electrode group includes a portion of the plurality of bonding electrodes, and the second bonding electrode group includes another portion of the plurality of bonding electrodes; and electrically connecting a first flexible circuit board and a second flexible circuit board to the plurality of bonding electrodes, wherein the first flexible circuit board has a first wiring region and a first fan-out region that are connected to each other; the first wiring region is closer to the selected side edge than the first fan-out region; the first flexible circuit board includes a plurality of first conductive contact pieces that are arranged at intervals in the first wiring region; each first conductive contact piece is electrically connected to a bonding electrode in the first bonding electrode group; the second flexible circuit board has a second wiring region and a second fan-out region that are connected to each other; the second wiring region is closer to the selected side edge than the second fan-out region; the second flexible circuit board includes a plurality of second conductive contact pieces that are arranged at intervals in the second wiring region; and each second conductive contact piece is electrically connected to a bonding electrode in the second bonding electrode group, wherein the first wiring region is closer to the selected side edge than the second wiring region in a first direction; the first fan-out region and the second wiring region have a distance therebetween in a second direction; the first direction is perpendicular to the second direction; and the second direction is an extension direction of the selected side edge; and in the second direction, a minimum distance between the first fan-out region and the second wiring region is greater than 1 mm.

14. The method according to claim 13, wherein before forming the plurality of bonding electrodes on the non-display surface, the method further comprises:

forming a protective film having a target shape, wherein the protective film includes a first portion and a second portion that are arranged in a third direction; a dimension of the first portion in a fourth direction is greater than a dimension of the second portion in the fourth direction; in the fourth direction, an end of the first portion and an end of the second portion that are located on a same side are flush with each other, and a maximum dimension of the protective film in the third direction is greater than or equal to a dimension of the non-display surface in the second direction, wherein the third direction is parallel to the second direction, and the fourth direction is parallel to the first direction;

attaching the protective film to a target position of the non-display surface of the initial display panel, wherein a direction in which the first portion and the second portion are arranged is parallel to the second direction; the end of the first portion and the end of the second portion flush with each other are away from the selected side edge; and each of the first portion and the second portion is at a designated distance from the selected side edge; and forming a metal layer at least on the non-display panel based on the protective film;

forming the plurality of bonding electrodes on the non-display surface, includes:

etching the metal layer to form the plurality of bonding electrodes on the non-display surface, wherein the plurality of bonding electrodes are divided into the first bonding electrode group and the second bonding electrode group with a boundary between the first portion and the second portion of the protective film as a dividing line.

15. The method according to claim 14, further comprising: forming at least one alignment mark on the non-display surface, wherein the at least one alignment mark includes a first alignment mark group, a second alignment mark group and a third alignment mark group that are arranged at internals in the first direction; the first alignment mark group includes a first alignment sub-mark and a second alignment sub-mark; the second alignment mark group includes a third alignment sub-mark, a fourth alignment sub-mark and a fifth alignment sub-mark; and the third alignment mark group includes a sixth alignment sub-mark and a seventh alignment sub-mark;
- forming the protective film having the target shape, includes: forming the protective film including a first hollowed-out region, a second hollowed-out region and a third hollowed-out region, wherein the first hollowed-out region, the second hollowed-out region and the third hollowed-out region respectively correspond to a position of the fifth alignment sub-mark, a position of the sixth alignment sub-mark and a position of the seventh alignment sub-mark;
- attaching the protective film to the target position of the non-display surface of the initial display panel, includes: causing portions of the non-display surface corresponding to the first hollowed-out region, the second hollowed-out region and the third hollowed-out region of the protective film to be exposed;
- forming the metal layer at least on the non-display panel based on the protective film, includes: causing the metal layer to further cover the portions, respectively exposing the first hollowed-out region, the second hollowed-out region and the third hollowed-out region of the protective film, of the non-display surface;
- etching the metal layer to form the plurality of bonding electrodes on the non-display surface, includes: forming the first alignment sub-mark, the second alignment sub-mark, the third alignment sub-mark, the fourth alignment sub-mark, the fifth alignment sub-mark, the sixth alignment sub-mark and the seventh alignment sub-mark simultaneously.

16. The method according to claim 15, wherein electrically connecting the first flexible circuit board and the second flexible circuit board to the plurality of bonding electrodes, includes:
- aligning the first flexible circuit board and the second flexible circuit board with the plurality of bonding electrodes according to the first alignment mark group, the second alignment mark group and the third alignment mark group; and
- electrically connecting the first flexible circuit board and the second flexible circuit board to the plurality of bonding electrodes.

17. The method according to claim 16, further comprising:
- according to the fourth alignment sub-mark and the fifth alignment sub-mark, coating a target position of the first bonding electrode group with a first adhesive film, and coating a target position of the second bonding electrode group with a second adhesive film;
- connecting the first flexible circuit board to the first bonding electrode group through the first adhesive film; and
- connecting the second flexible circuit board to the second bonding electrode group through the second adhesive film, wherein
- the first adhesive film and the second adhesive film each extend in the second direction, and the first adhesive film is closer to the selected side edge than the second adhesive film.

18. The method according to claim 17, further comprising:
- after etching the metal layer and before a step of electrically connecting the first flexible circuit board and the second flexible circuit board to the plurality of bonding electrodes, peeling off the protective film from the non-display surface.

19. The method according to claim 13, wherein the initial display panel further includes a display surface and a plurality of side surfaces connecting the display surface to the non-display surface;
- forming the plurality of bonding electrodes on the non-display surface, includes:
- forming a plurality of side lines simultaneously on a side surface proximate to the selected side edge, wherein the plurality of side lines are arranged at intervals; an end of each side line extends to the display surface, and another end of the side line extends to the non-display surface;
- and the another end of the side line extends to the non-display surface serves as one of the plurality of bonding electrodes.

20. A display module, comprising:
- a display panel, wherein a non-display surface of the display panel includes a plurality of side edges, and the plurality of side edges include at least one selected side edge; the display panel includes a plurality of bonding electrodes disposed on the non-display surface, and the plurality of bonding electrodes are sequentially arranged at intervals along a selected side edge; the plurality of bonding electrodes are divided into a first bonding electrode group and a second bonding electrode group; the first bonding electrode group includes a portion of the plurality of bonding electrodes, and the second bonding electrode group includes another portion of the plurality of bonding electrodes;
- a first flexible circuit board having a first wiring region and a first fan-out region that are connected to each other, wherein the first wiring region is closer to the selected side edge than the first fan-out region; the first flexible circuit board includes a plurality of first conductive contact pieces that are arranged at intervals in the first wiring region; and each first conductive contact piece is electrically connected to a bonding electrode in the first bonding electrode group; and
- a second flexible circuit board having a second wiring region and a second fan-out region that are connected to each other, wherein the second wiring region is closer to the selected side edge than the second fan-out region; the second flexible circuit board includes a plurality of second conductive contact pieces that are arranged at intervals in the second wiring region; and each second conductive contact piece is electrically connected to a bonding electrode in the second bonding electrode group,
- wherein the first wiring region is closer to the selected side edge than the second wiring region in a first direction; the first fan-out region and the second wiring region have a distance therebetween in a second direction; the first direction is perpendicular to the second direction; and the second direction is an extension direction of the selected side edge;
- wherein the at least one selected side edge includes two selected side edges disposed opposite to each other; the selected side edge corresponding to the plurality of bonding electrodes, the first flexible circuit board and the second flexible circuit board is a selected side edge of the two selected side edges;
- the display panel further includes another plurality of bonding electrodes disposed on the non-display surface;
- the display module further includes another first flexible circuit board and another second flexible circuit board; the another first flexible circuit board are bonded to a first bonding electrode group included in the another plurality of bonding electrodes at another selected side edge of the two selected side edges; the another second flexible circuit board are bonded to a second bonding electrode group included in the another plurality of bonding electrodes at the another selected side edge of the two selected side edges, wherein the first flexible circuit board corresponding to the selected side edge is disposed opposite to the another second flexible circuit board corresponding to the another selected side edge; and the second flexible circuit board corresponding to the selected side edge is disposed opposite to the another first flexible circuit board corresponding to the another selected side edge.

* * * * *